(12) United States Patent
Lim et al.

(10) Patent No.: US 12,101,896 B2
(45) Date of Patent: Sep. 24, 2024

(54) ELECTRONIC DEVICE INCLUDING SLIDE-OUT DISPLAY

(71) Applicant: SAMSUNG ELECTRONICS CO., LTD., Suwon-si (KR)

(72) Inventors: Gisoo Lim, Suwon-si (KR);
Myunghoon Kwak, Suwon-si (KR);
Raetae Kim, Suwon-si (KR);
Yongyoun Kim, Suwon-si (KR);
Byunghun Cho, Suwon-si (KR);
Joongyeon Cho, Suwon-si (KR);
Byounguk Yoon, Suwon-si (KR);
Hyunju Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 268 days.

(21) Appl. No.: 17/713,487

(22) Filed: Apr. 5, 2022

(65) Prior Publication Data
US 2022/0232716 A1    Jul. 21, 2022

Related U.S. Application Data

(63) Continuation of application No. PCT/KR2021/005484, filed on Apr. 29, 2021.

(30) Foreign Application Priority Data

May 20, 2020   (KR) .......................... 10-2020-0060146

(51) Int. Cl.
*H05K 5/02*   (2006.01)
*H05K 5/00*   (2006.01)

(52) U.S. Cl.
CPC ......... *H05K 5/0217* (2013.01); *H05K 5/0017* (2013.01)

(58) Field of Classification Search
CPC .... G06F 1/1652; G06F 1/1624; G06F 1/1637; G06F 1/16; G06F 1/1641; G06F 1/1616;
(Continued)

(56) References Cited

U.S. PATENT DOCUMENTS

| 8,711,566 B2 * | 4/2014 | O'Brien | G06F 1/1652 |
| | | | 361/724 |
| 10,747,269 B1 * | 8/2020 | Choi | H04M 1/0237 |

(Continued)

FOREIGN PATENT DOCUMENTS

| EP | 3702880 | 9/2020 |
| KR | 10-2012-0013990 | 2/2012 |

(Continued)

OTHER PUBLICATIONS

Extended European Search Report dated Sep. 26, 2023 issued in European Patent Application No. 21809784.8.
(Continued)

*Primary Examiner* — Michael A Matey
(74) *Attorney, Agent, or Firm* — Nixon & Vanderhye, P.C.

(57) ABSTRACT

According to an embodiment of the disclosure, an electronic device may include: a housing, a sliding plate configured to slide-out from the housing, a flexible display including a first section coupled to overlap the sliding plate, and a bendable section extending from the first section and configured to be pulled out from an inner space of the housing during the slide-out, a support sheet disposed on a rear surface of the flexible display, a first curved portion located inside the housing to correspond to the bendable section, a belt connecting the support sheet and the sliding plate to each other, and a second curved portion located inside the housing to correspond to the belt and spaced apart from the first curved portion in a slide-out direction.

13 Claims, 26 Drawing Sheets

(58) Field of Classification Search
CPC ...... G06F 3/147; G06F 1/1601; G06F 1/3218; H04M 1/0268; H04M 1/0237; H04M 1/0235; H04M 1/0239; H04M 2201/38; H05K 7/20954; H05K 2201/10128; H05K 7/1427; H05K 7/183; G09F 9/301

See application file for complete search history.

(56) References Cited

U.S. PATENT DOCUMENTS

| | | | |
|---|---|---|---|
| 11,016,532 | B2 | 5/2021 | Yang |
| 2010/0279748 | A1 | 11/2010 | Kristensson et al. |
| 2015/0009635 | A1 | 1/2015 | Kang et al. |
| 2018/0014417 | A1* | 1/2018 | Seo ............... H05K 7/20954 |
| 2018/0102072 | A1* | 4/2018 | Lee ........................ G09G 3/20 |
| 2018/0103552 | A1 | 4/2018 | Seo et al. |
| 2018/0188778 | A1* | 7/2018 | Shin ..................... G06F 1/1652 |
| 2019/0196548 | A1 | 6/2019 | Kim et al. |
| 2019/0198783 | A1 | 6/2019 | Kim et al. |
| 2019/0207141 | A1 | 7/2019 | Kim et al. |
| 2019/0268455 | A1* | 8/2019 | Baek ..................... G06F 1/1684 |
| 2019/0305237 | A1* | 10/2019 | Shin ..................... H04M 1/0268 |
| 2020/0120814 | A1 | 4/2020 | Huang |
| 2020/0313112 | A1* | 10/2020 | Lee ........................ H10K 59/00 |
| 2020/0314225 | A1* | 10/2020 | Ahn ........................ G09F 9/301 |
| 2020/0363841 | A1* | 11/2020 | Kim ........................ G06F 1/1626 |
| 2021/0044683 | A1* | 2/2021 | He ........................ G06F 1/1652 |
| 2021/0135151 | A1 | 5/2021 | Baek et al. |
| 2021/0135492 | A1* | 5/2021 | Kim ........................ H02J 50/10 |
| 2021/0219437 | A1* | 7/2021 | Kim ..................... H04M 1/0237 |

FOREIGN PATENT DOCUMENTS

| | | |
|---|---|---|
| KR | 10-2015-0004193 | 1/2015 |
| KR | 10-2016-0141255 | 12/2016 |
| KR | 10-1792692 | 11/2017 |
| KR | 10-2018-0040181 | 4/2018 |
| KR | 10-2019-0004618 | 1/2019 |
| KR | 10-2019-0062855 | 6/2019 |
| KR | 10-2020-0013821 | 2/2020 |
| WO | 2019/146865 | 8/2019 |

OTHER PUBLICATIONS

Office Action dated Feb. 14, 2024 in Korean Patent Application No. 10-2020-0060146 and English-language translation.

* cited by examiner

ELECTRONIC DEVICE INCLUDING SLIDE-OUT DISPLAY

CROSS-REFERENCE TO RELATED APPLICATIONS

This application is a continuation of International Application No. PCT/KR2021/005484 designating the United States, filed on Apr. 29, 2021, in the Korean Intellectual Property Receiving Office and claiming priority to Korean Patent Application No. 10-2020-0060146, filed on May 20, 2020, in the Korean Intellectual Property Office, the disclosures of which are incorporated by reference herein in their entireties.

BACKGROUND

Field

The disclosure relates to an electronic device including a slide-out display.

Description of Related Art

With the development of digital technologies, electronic devices are being provided in various forms such as a smartphone, a tablet personal computer (PC), and a personal digital assistant (PDA). Electronic devices are being designed to provide a larger screen while having a portable size that does not cause inconvenience to a user's hand.

An electronic device may be implemented to be capable of extending a screen, for example, in a slide manner. For example, a portion of a flexible display is pulled out from the inner space of the electronic device in a slide manner, whereby the screen can be expanded. However, a non-smooth screen may be provided due to lifting due to elasticity of the flexible display in the state in which the screen is expanded. In order to prevent and/or reduce this, a tension structure for the flexible display may be provided, but it may be difficult to assemble electrical mechanical elements in the electronic device while maintaining the tension, and it may also be difficult to maintain the tension due to the repetition of the slide operation.

SUMMARY

Embodiments of the disclosure provide an electronic device including a slide-out display that maintains tension on a flexible display and enables a smooth slide operation.

According to an example embodiment of the disclosure, an electronic device may include: a housing, a sliding plate configured to slide-out from the housing, a flexible display including a first section coupled to overlap the sliding plate, and a bendable section extending from the first section and configured to be pulled out from an inner space of the housing during the slide-out, a support sheet disposed on a rear surface of the flexible display, a first curved portion located inside the housing and corresponding to the bendable section, a belt connecting the support sheet and the sliding plate to each other, and a second curved portion located inside the housing corresponding to the belt and spaced apart from the first curved portion in a slide-out direction.

According to various example embodiments of the disclosure, since a smooth screen is provided by maintaining tension on the flexible display and a smooth slide operation is enabled, reliability of an electronic device including a slide-out display can be improved.

In addition, effects that can be obtained by various example embodiments of the disclosure will be directly or implicitly disclosed in the detailed description of the embodiments of the disclosure. For example, various effects according to various example embodiments of the disclosure will be disclosed in the following detailed description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1A:
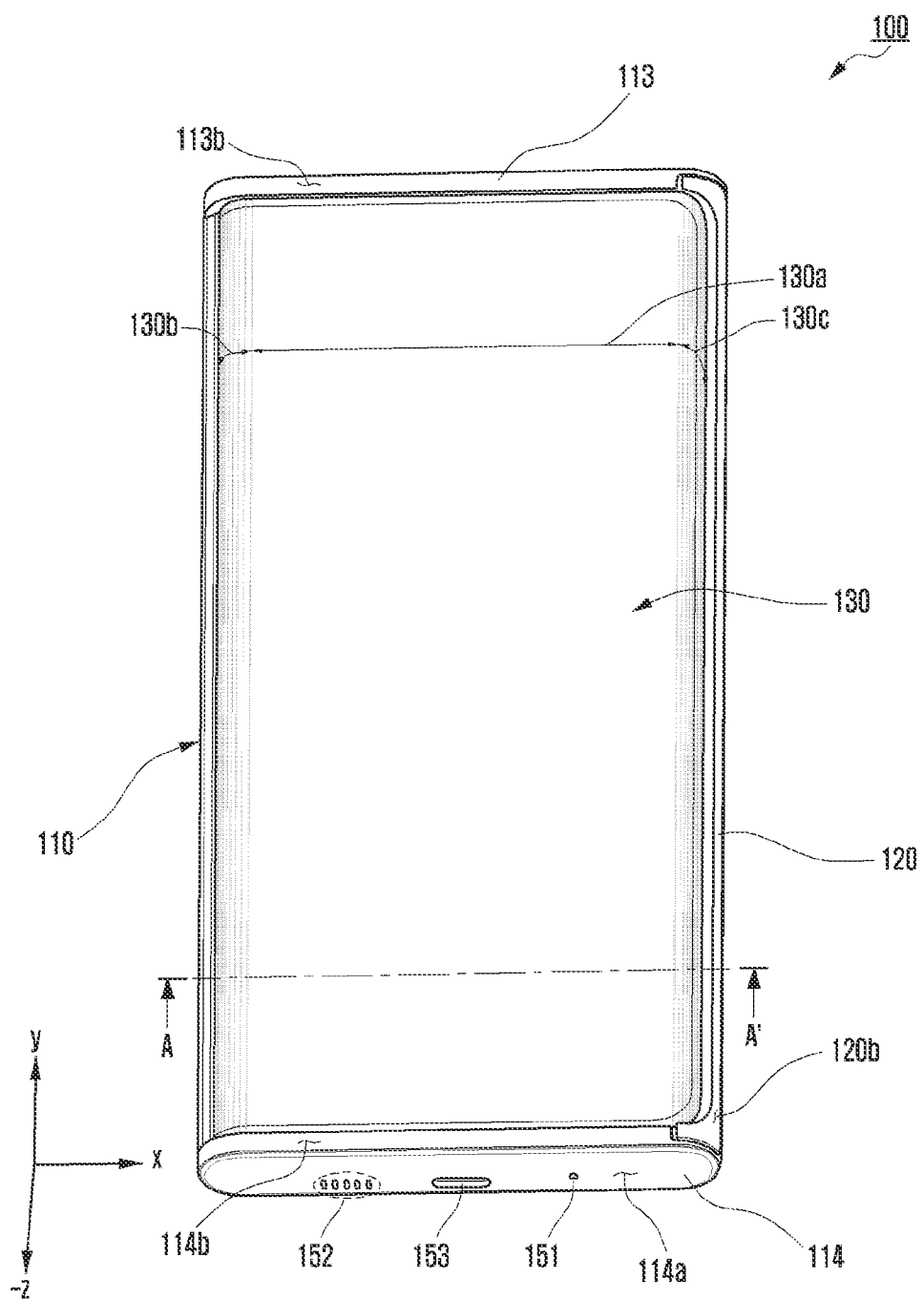
FIG. 1A is a front perspective view illustrating a slidable electronic device in a closed state according to various embodiments.

Hereinafter, various example embodiments of the disclosure will be described with reference to the accompanying drawings.

It should be understood that various embodiments of the disclosure and terms for describing the embodiments are not intended to limit the technical features disclosed herein to specific embodiments, and that the embodiments include various modifications, equivalents, and/or substitutions of the corresponding embodiments. In connection with the description of the drawings, similar or related components may be denoted by similar reference numerals. The singular form of a noun corresponding to an item may include one or more of the items unless the context clearly indicates otherwise. Herein, each of phrases, such as "A or B", "at least one of A and B", "at least one of A or B", "A, B, or C", "at least one of A, B, and C", and "at least one of A, B, or C" may include any one of the items listed together in the corresponding phrase or all possible combinations of the items. Terms such as "$1^{st}$", "$2^{nd}$", "first", or "second" may be used simply to distinguish corresponding components from other components, and the components are not limited in other respects (e.g., importance or order).

An electronic device according to various embodiments disclosed herein may be any of various types of devices. The electronic device may include, for example, a portable communication device (e.g., a smartphone), a computer device, a portable multimedia device, a portable medical device, a camera, a wearable device, a home appliance, or the like. The electronic device according to an embodiment disclosed herein is not limited to the above-described devices.

Figure 1B:
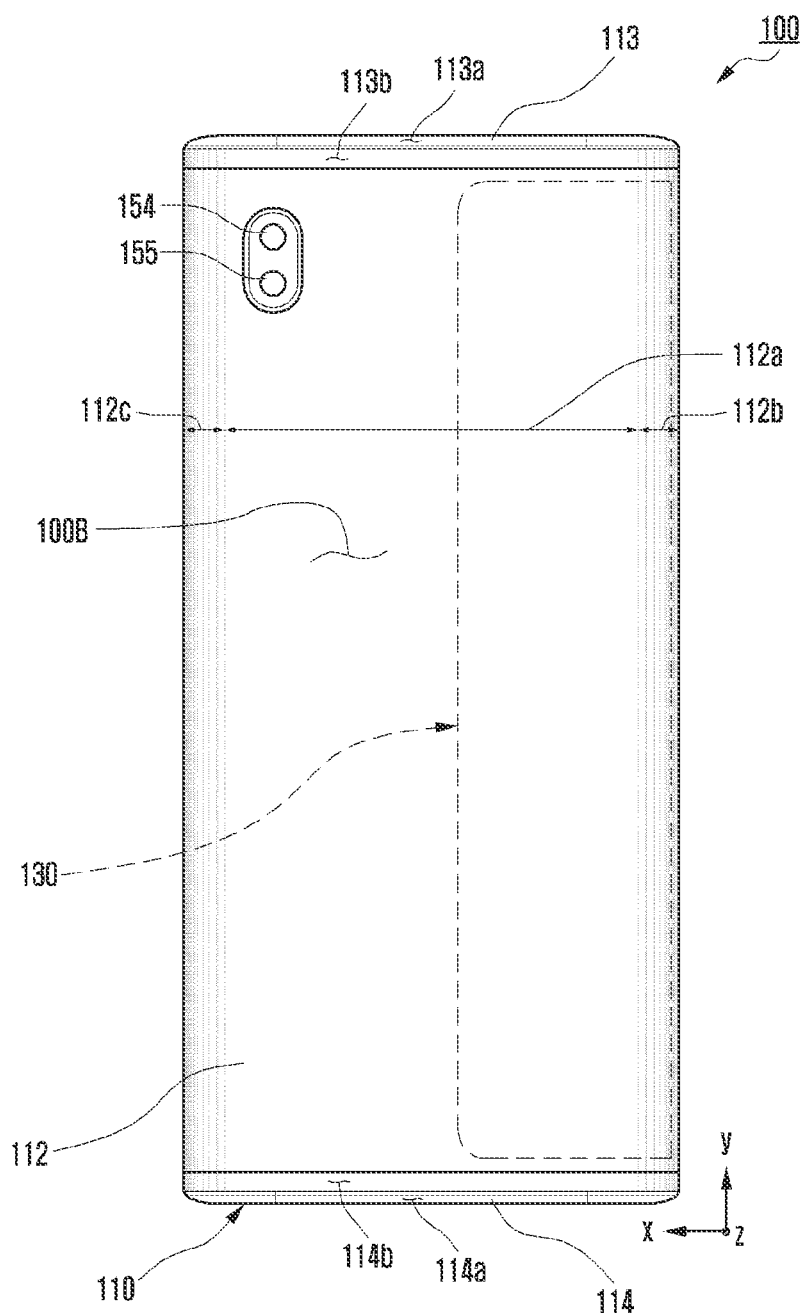
FIG. 1B is a rear perspective view illustrating a slidable electronic device in the closed state according to various embodiments.
Figure 2A:
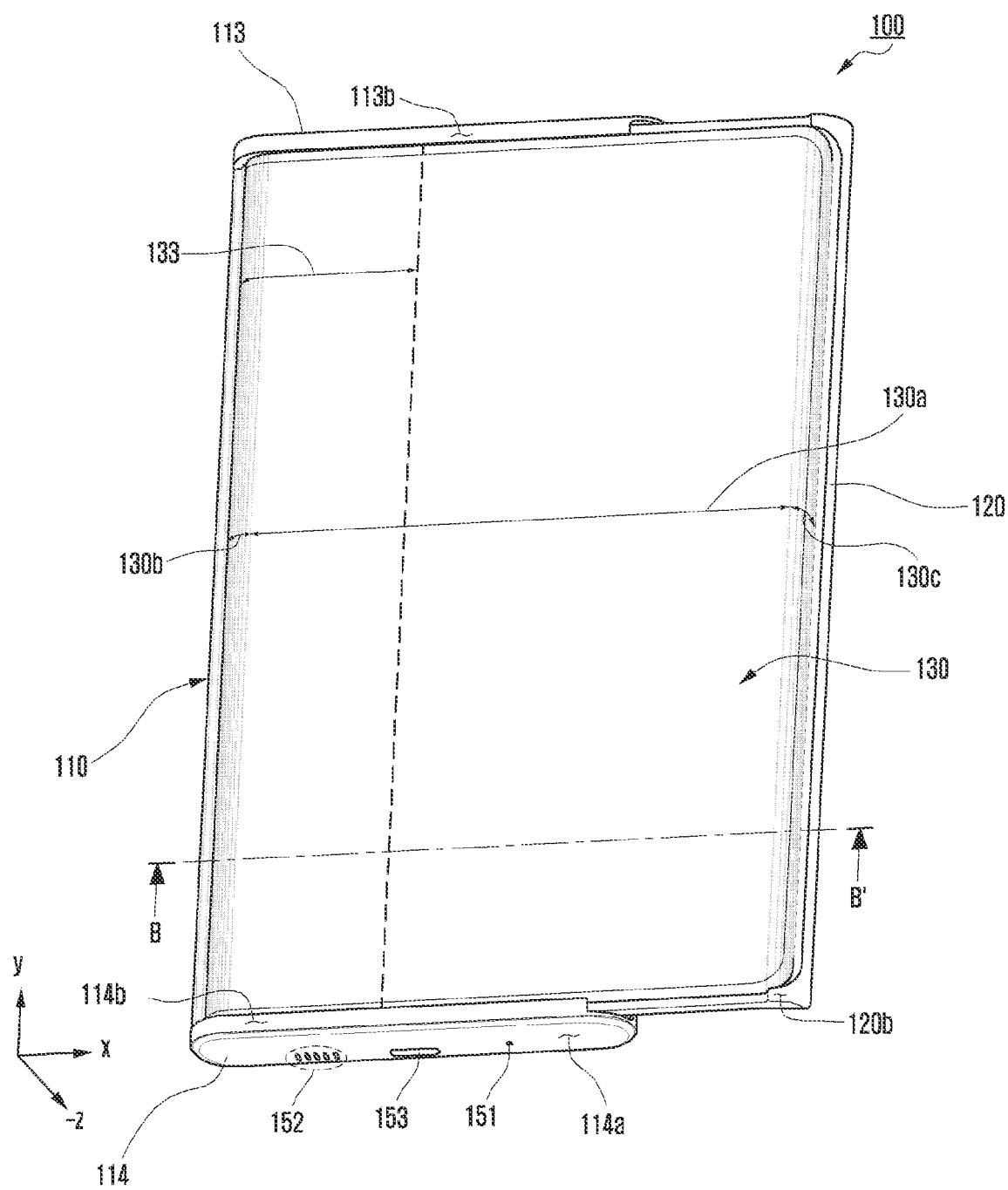
FIG. 2A is a front perspective view illustrating a slidable electronic device in an open state according to various embodiments.
Figure 2B:
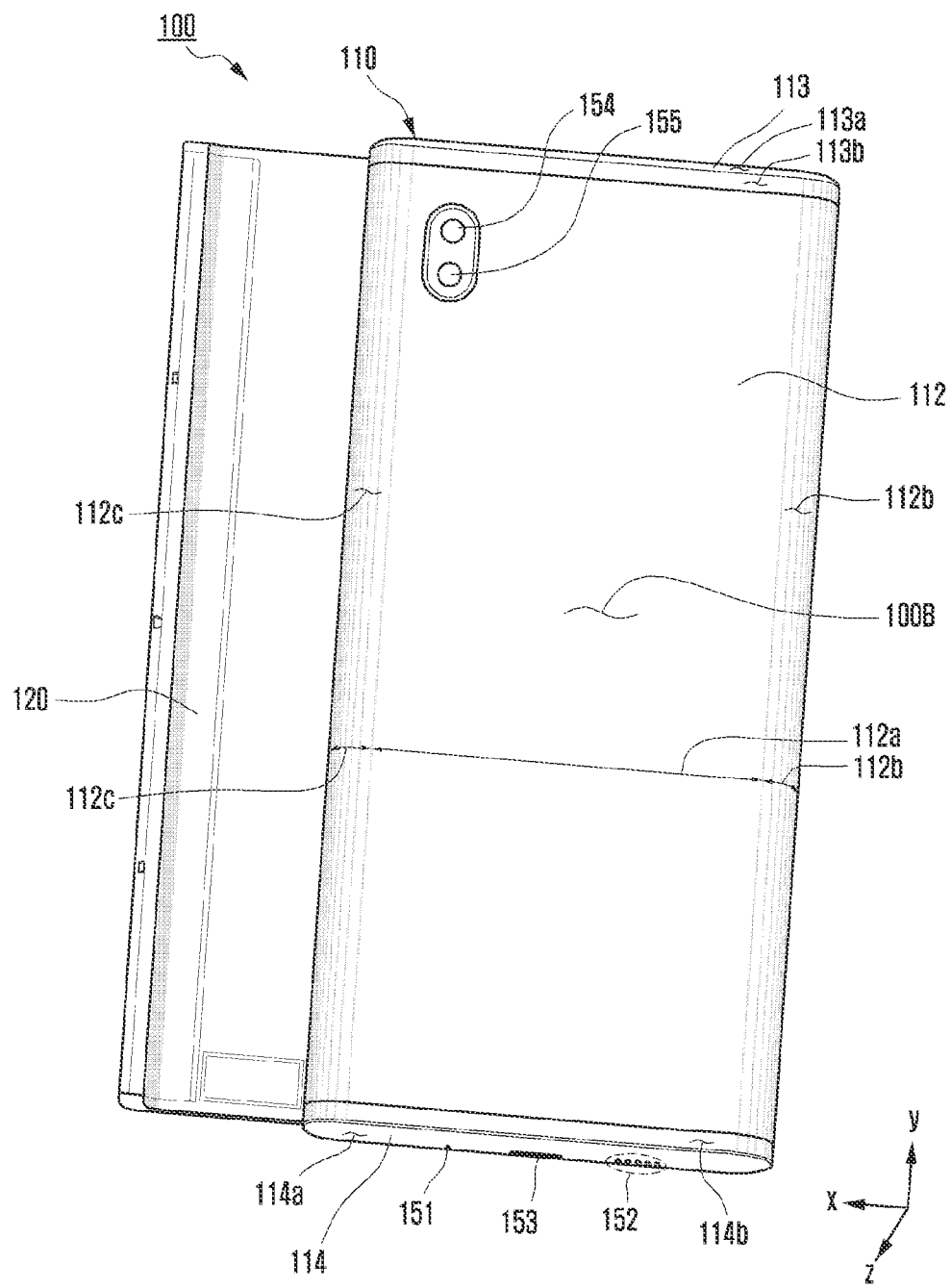
FIG. 2B is a rear perspective view illustrating a slidable electronic device in the open state according to various embodiments.

FIG. 1A is a front perspective view illustrating a slidable electronic device 100 in a closed state according to various embodiments. FIG. 1B is a rear perspective view illustrating the slidable electronic device 100 in the closed state according to various embodiments. FIG. 2A is a front perspective view illustrating the slidable electronic device 100 in an open state according to various embodiments. FIG. 2B is a rear perspective view illustrating the slidable electronic device 100 in the open state according to various embodiments.

Referring to FIGS. 1A, 1B, 2A, and 2B, in an embodiment, the electronic device 100 may be implemented to expand a screen in a sliding manner. FIGS. 1A and 1B illustrate the electronic device 100 in a state in which the screen is not expanded, and FIGS. 2A and 2B show the electronic device 100 in a state in which the screen is expanded. The state in which the screen is not expanded is a state in which a sliding plate 120 for a sliding motion of a display 130 is not slid-out, and may be referred to as a "closed state" below. The state in which the screen is expanded is a maximally expanded state in which the screen is not expanded any more due to the slide-out of the sliding plate 120, which may be referred to as an "open state" below. According to various embodiments, the open state may be referred to as a state in which the screen is expanded compared to the closed state, and the screens may be provided in various sizes depending on the moving position of the sliding plate 120. The screen is an active area of the flexible display 130 that is visible to output an image, and the electronic device 100 is capable of adjusting the active area depending on the movement of the sliding plate 120 or the movement of the flexible display 130. In the following description, the open state may refer to a state in which the screen is maximally expanded. In various embodiments, the flexible display 130, which is disposed to be slidable in the electronic device 100 of FIG. 1A to provide a screen, may be referred to as a "slide-out display" or an "expandable display". In various embodiments, the electronic device 100 may be referred to as a "rollable" electronic device.

According to an embodiment, the electronic device 100 may include a sliding structure based on an elastic structure connected to (or associated with) the flexible display 130. When the flexible display 130 is moved to a set distance by an external force, the flexible display 130 may be switched from the closed state to the open state or from the open state to the closed state without any further external force due to an elastic structure (e.g., a semi-automatic slide operation).

According to various embodiments, when a signal is generated via an input device included in the electronic device 100, the electronic device 100 may be switched from the closed state to the open state or from the open state to the closed state due to a driving device such as a motor connected to the flexible display 130. For example, when a signal is generated via a hardware button or a software button provided through the screen, the electronic device 100 may be switched from the closed state to the open state or from the open state to the closed state.

According to various embodiments, when a signal is generated from various sensors such as a pressure sensor, the electronic device 100 may be switched from the closed state to the open state or from the open state to the closed state. For example, when carrying or grasping the electronic device 100 by hand, a squeeze gesture in which a portion of the hand (e.g., the palm or fingers) presses a portion within a predetermined section of the electronic device 100 may be detected by a sensor, and in response thereto, the electronic device 100 may be switched from the closed state to the open state or from the open state to the closed state.

According to an embodiment, the flexible display 130 may include a first bendable section 133 (see FIG. 2A). The first bendable section 133 may provide an expanded portion of the screen when the electronic device 100 is switched from the closed state to the open state. When the electronic device 100 is switched from the closed state to the open state, the first bendable section 133 is pulled out from the inner space of the electronic device 100 in a sliding manner, and thus the screen can be expanded. When the electronic device 100 is switched from the open state to the closed state, the first bendable section 133 is introduced into the inner space of the electronic device 100 in a sliding manner, and thus the screen can be contracted. When the electronic device 100 is switched from the open state to the closed state, the first bendable section 133 may be bent and moved into the inner space of the electronic device 100. The display 130 may be implemented using a flexible display based on a flexible substrate (e.g., a plastic substrate) formed of a polymer material including polyimide (PI) or polyester (PET (polyester)), and may be referred to as a flexible display below.

According to an embodiment, the electronic device 100 may include a housing 110, a sliding plate 120, and/or a flexible display 130.

The housing (or a case) 110 may include, for example, a back cover 112, a first side cover 113, and/or a second side cover 114. The back cover 112, the first side cover 113, and/or the second side cover 114 may be connected to a support member (not illustrated) located inside the electronic device 100, and may define at least a portion of the external appearance of the electronic device 100.

The back cover 112 may define, for example, at least a portion of the rear surface 100B of the electronic device 100. The back cover 112 may be substantially opaque. The back cover 112 may be made of coated or colored glass, ceramic, polymer, metal (e.g., aluminum, stainless steel (STS), or magnesium), or a combination of at least two of these materials. According to various embodiments, at least a partial area of the back cover 112 may be transparent or may include an opening, and an image output from the flexible display 130 in the closed state of FIG. 1B may be visible through the partial area.

According to an embodiment, the back cover 112 may include a flat portion 112a and curved portions 112b and 112c located opposite to each other with the flat portion 112a interposed therebetween. The curved portions 112b and 112c may be disposed adjacent to opposite long edges (not illustrated) of the back cover 112, respectively, and may be bent and extend seamlessly toward the screen located opposite to the back cover 112. According to various embodiments, the back cover 112 may include one of the curved portions 112b and 112c or may be implemented without the curved portions 112b and 112c.

According to an embodiment, the first side cover 113 and the second side cover 114 may be located opposite to each other. The first side cover 113 may define a first side surface 113a of the electronic device 100, and the second side cover 114 may define a second side surface 114a of the electronic device 100 that faces away from the first side cover 113a. The first side cover 113 may include a first peripheral portion (or a first rim) 113b extending from an edge of the first side surface 113a, and the first peripheral portion 113b may provide at least a portion of one side bezel of the electronic device 100. The second side cover 114 may include a second peripheral portion (or a second rim) 114b extending from an edge of the second side surface 114a, and the second peripheral portion 114b may provide at least a portion of the other side bezel of the electronic device 100.

According to an embodiment, the sliding plate 120 may be slidable on a support member (not illustrated) located inside the electronic device 100. The flexible display 130 may be disposed on the sliding plate 120, and the closed state of FIG. 1A or the open state of FIG. 2A may be formed based on the position of the sliding plate 120 on the support member. According to an embodiment, the flexible display 130 may be attached to the sliding plate 120 via an adhesive member (not illustrated) such as a double-sided tape. According to an embodiment, the adhesive member may include a thermally reactive adhesive member, a photoreactive adhesive member, an ordinary adhesive, and/or a double-sided tape. According to various embodiments, the flexible display 130 may be inserted into a recess provided at the sliding plate 120 in a sliding manner to be disposed on and fixed to the sliding plate 120. The sliding plate 120 may include a third peripheral portion 120b that defines an outer surface of the electronic device 100, and the third peripheral portion 120b may provide a bezel around the screen together with the first peripheral portion 113b and the second peripheral portion 114b in the closed state of FIG. 1A. In the closed state of FIG. 1A, the surface (not illustrated) of the third peripheral portion 120b may be smoothly connected to the surface (not illustrated) of the first peripheral portion 113b and/or the surface of the second peripheral portion 114b.

The flexible display 130 may define, for example, a screen located opposite to the back cover 112. According to an embodiment, the flexible display 130 may include a first bendable section 133, which can be pulled out from the inner space of the housing 110. Due to the slide-out of the sliding plate 120, at least a portion of the first bendable section 133 comes out from the inside of the electronic device 100 so that the screen can be provided in the expanded state (e.g., the open state) as illustrated in FIG. 2A.

According to an embodiment, in the closed state of FIG. 1A, the screen may include a flat portion 130a, and a first curved portion 130b and a second curved portion 130c located opposite to each other with the flat portion 130a interposed therebetween. For example, the first curved portion 130b and the second curved portion 130c may be substantially symmetrical to each other with the flat portion 130a interposed therebetween. In the closed state of FIG. 1A, the first curved portion 130b and the second curved portion 130c may be located to correspond to the curved portions 112b and 112c of the back cover 112, respectively, and may be curved toward the back cover 112. When the electronic device 100 is switched from the closed state of FIG. 1A to the open state of FIG. 2A, the flat portion 130a may be expanded. For example, a partial area of the first bendable section 133 that forms the first curved portion 130b in the closed state of FIG. 1A may be included in the flat portion 130a expanded when the electronic device 100 is switched from the closed state of FIG. 1A to the open state of FIG. 2A and may be formed as another area of the first bendable section 133. According to an embodiment, the electronic device 100 may include an opening (not illustrated) for introducing or pulling-out of the first bendable section 133, and a pulley (not illustrated) located in the opening. The pulley may be located to correspond to the first bendable section 133, and the movement and the direction of movement of the first bendable section 133 may be guided through the rotation of the pulley during the switching between the closed state of FIG. 1A and the open state of FIG. 2A. The first curved portion 130b may be provided by a portion corresponding to the curved surface of the pulley in the first bendable section 133. The second curved portion 130c may be provided to correspond to a curved surface provided on one surface of the sliding plate 120. The second curved portion 130c may be located opposite to the first curved portion 130b in the closed state or the open state of the electronic device 100 to improve the aesthetics of the screen. According to various embodiments, the flat portion 130a may be implemented in the expanded form without the second curved portion 130c.

According to an embodiment, the flexible display 130 may further include a touch detection circuit (e.g., a touch sensor). The touch detection circuit may be implemented as a transparent conductive layer (or a film) based on various conductive materials such as indium tin oxide (ITO). For example, the touch detection circuit may be located between an optical layer (e.g., a layer for improving image quality or outdoor visibility of a screen, such as a polarization layer) and a light-emitting layer (e.g., a layer including a plurality of pixels implemented by light-emitting elements, such as OLEDs, and at least one thin film transistor (TFT) for controlling the same) of the flexible display 130 (e.g., an on-cell type). As another example, the touch detection circuit may be located between a transparent cover (e.g., a cover made of a material, such as polyimide or ultra-thin glass (UTG), and exposed to the outside) and the optical layer (e.g., a polarization layer) (e.g., an add-on type). As another example, the light-emitting layer may include a touch detection circuit or a touch sensing function (e.g., an in-cell type). According to various embodiments (not illustrated), the flexible display 130 may be coupled to or disposed adjacent to a pressure sensor capable of measuring the intensity (pressure) of a touch, and/or a digitizer configured to detect a magnetic field-type pen input device (e.g., a stylus pen). For example, the digitizer may include a coil member disposed on a dielectric substrate to detect an electromagnetically induced resonance frequency applied from a pen input device.

According to an embodiment, the electronic device 100 may include a microphone hole 151, a speaker hole 152, a connector hole 153, a camera device (or a camera module) 154, or a flash 155. According to various embodiments, at least one of the components may be omitted from the electronic device 100 or other components may be additionally included in the electronic device 100.

The microphone hole 151 may be provided, for example, in at least a portion of the second side surface 114a to correspond to a microphone (not illustrated) located inside the electronic device 100. The position of the microphone hole 151 is not limited to the embodiment of FIG. 1A and may vary. According to various embodiments, the electronic device 100 may include a plurality of microphones capable of detecting the direction of sound.

The speaker hole 152 may be provided, for example, in at least a portion of the second side surface 114a to correspond to a speaker located inside the electronic device 100. The position of the speaker hole 152 is not limited to the embodiment of FIG. 1A and may vary. According to various embodiments, the electronic device 100 may include a receiver hole for a call. In various embodiments, the microphone hole 151 and the speaker hole 152 may be implemented as one hole, or the speaker hole 152 may be omitted like a piezo speaker.

The connector hole 153 may be provided, for example, in at least a portion of the second side surface 114a to correspond to a connector (e.g., a USB connector) located inside the electronic device 100. The electronic device 100 may transmit and/or receive power and/or data to/from an external electronic device electrically connected to the connector through the connector hole 153. The position of the connector hole 153 is not limited to the embodiment of FIG. 1A and may vary.

The camera device 154 and the flash 155 may be located, for example, on the rear surface 100B of the electronic device 100. The camera device 154 may include one or more lenses, an image sensor, and/or an image signal processor. The flash 155 may include, for example, a light-emitting diode or a xenon lamp. In various embodiments, two or more lenses (e.g., an infrared camera lens, a wide-angle lens, and a telephoto lens) and image sensors may be located on one surface of the electronic device 100. According to various embodiments, without being limited to the embodiment of FIG. 1B or FIG. 2B, the electronic device 100 may include a plurality of camera devices (or a plurality of camera modules). The camera device 154 may be one of the plurality of camera devices. For example, the electronic device 100 may include a plurality of camera devices (e.g., a dual camera or a triple camera) having different properties (e.g., angles of view) or functions, respectively. For example, a plurality of camera devices (e.g., the camera device 154) including lenses having different angles of view may be configured, and the electronic device 100 may be configured to control the camera devices to perform change of angles of view implemented therein based on a user's selection. In addition, the plurality of camera devices may include at least one of a wide-angle camera, a telephoto camera, a color camera, a monochrome camera, or an infrared (IR) camera (e.g., a time of flight (TOF) camera or a structured light camera). According to an embodiment, the IR camera may be operated as at least a part of a sensor module (not illustrated). According to various embodiments (not illustrated), the electronic device 100 may further include a camera device (e.g., a front camera) that generates an image signal based on light received through the front surface (not illustrated) of the electronic device 100 placed in a direction in which the screen is oriented. For example, the camera device 154 is not limited to the embodiment of FIG. 1B or FIG. 2B, and may be located inside the housing 110 to be aligned with an opening (e.g., a through hole, or a notch) provided in the flexible display 130. The camera device 154 may receive light through the opening and a partial area of a transparent cover overlapping the opening to generate an image signal. The transparent cover may be formed of a material such as polyimide or ultrathin glass (UTG) to protect the flexible display 130 from the outside.

According to various embodiments, without being limited to the embodiment of FIG. 1B or FIG. 2B, in the electronic device 100, the camera device 154 may be disposed at the lower end of at least a portion of the screen of the flexible display 130 to perform related functions (e.g., image capturing) in the state in which the position thereof is not visually distinguished (or exposed). For example, the camera device 154 is disposed to overlap at least a portion of the screen when viewed from above the screen (e.g., when viewed in the −z-axis direction) so that the camera device 154 can acquire an image of an external subject without being exposed to the outside.

According to various embodiments (not illustrated), the electronic device 100 may further include a key input device. The key input device may be located, for example, on the first side surface 113a of the electronic device 100 that is provided by the first side cover 113. In various embodiments (not illustrated), the key input device may include at least one sensor module.

According to various embodiments (not illustrated), the electronic device 100 may include various sensor modules. A sensor module may generate electrical signals or data values corresponding to the internal operating states or the external environmental states of the electronic device 100. For example (not illustrated), the sensor module may include a proximity sensor that generates a signal regarding proximity of an external object based on light received through the front surface (not illustrated) of the electronic device 100 placed in a direction in which the screen is oriented. As another example (not illustrated), the sensor module may include various biometric sensors, such as a fingerprint sensor and an HRM sensor, for detecting biometric information based on light received through the front or rear surface 100B of the electronic device. The electronic device 100 may include at least one of various other sensor modules, such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

Figure 3:
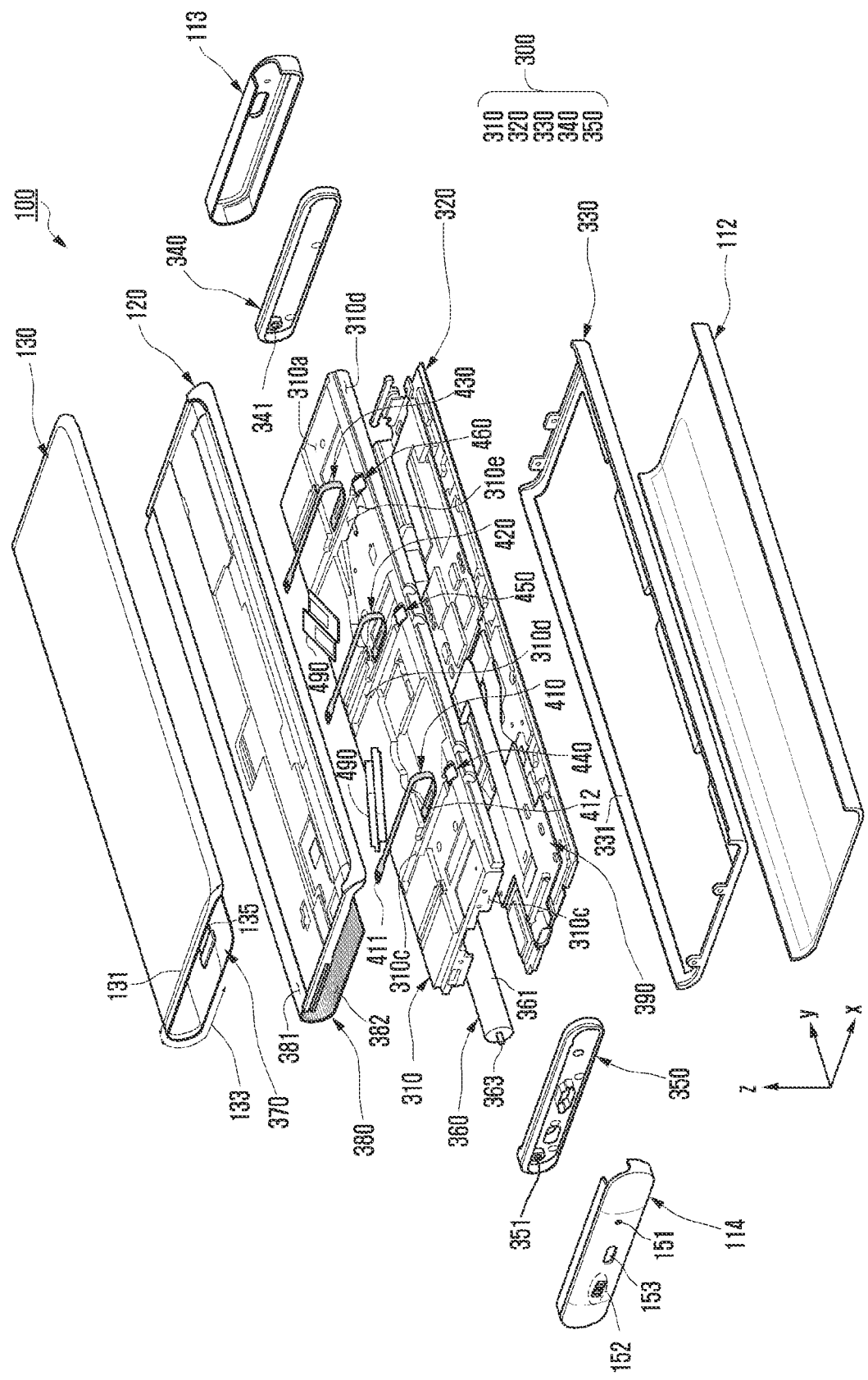
FIG. 3 is an exploded perspective view of the slidable electronic device of FIG. 1A according to various embodiments.

FIG. 3 is an exploded perspective view of the electronic device 100 of FIG. 1A according to various embodiments.

Referring to FIG. 3, in an embodiment, the electronic device 100 may include a back cover 112, a first side cover 113, a second side cover 114, a support member assembly 300, a first pulley 360, sliding plate 120, flexible display 130, a support sheet 370, a multi-bar structure (or a multi-bar assembly) 380, a printed circuit board 390 (e.g., a printed circuit board (PCB), a flexible PCB (FPCB), or a rigid-flexible PCB (RFPCB)), a first belt 410, a second belt 420, a third belt 430, a second pulley 440, a third pulley 450, and/or a fourth pulley 460. A redundant description of some of the reference numerals in FIG. 3 may not be repeated here.

According to an embodiment, the support member assembly (or a support structure) 300 is a frame structure capable of withstanding a load, and may contribute to durability or rigidity of the electronic device 100. At least a portion of the support member assembly 300 may include a non-metal material (e.g., polymer) and/or a metal material. The housing 110 (see FIG. 1A) including the back cover 112, the first side cover 113, or the second side cover 114, the first pulley 360, the sliding plate 120, and the flexible display 130, the support sheet 370, the multi-bar structure 380, the printed circuit board 390, the first belt 410, the second belt 420, the third belt 430, the second pulley 440, the third pulley 450, or the fourth pulley 460 may be disposed on the support member assembly 300.

According to an embodiment, the support member assembly 300 may include a first support member 310, a second support member 320, a third support member 330, a fourth support member 340, or a fifth support member 350.

The first support member (or a first bracket) 310 may be, for example, in the form of a plate, and the sliding plate 120 may be disposed on one surface 310a of the first support member 310. The second support member (or a second bracket) 320 may be, for example, in the form of a plate overlapping the first support member 310 and may be coupled to the first support member 310 and/or the third support member 330. The third support member 330 may be coupled to the first support member 310 and/or the second support member 320 with the second support member 320 interposed therebetween. The printed circuit board 390 may be disposed on the second support member 320 between the first support member 310 and the second support member 320. The fourth support member 340 may be coupled to one side of an assembly (not illustrated) in which the first support member 310, the second support member 320, and the third support member 330 are coupled to each other. The fifth support member 350 may be coupled to the other side of the assembly (not illustrated) in which the first support member 310, the second support member 320, and the third support member 330 are coupled to each other, and may be located opposite to the fourth support member 340. The first side cover 113 may be coupled to the support member assembly 300 from the side of the fourth support member 340. The second side cover 114 may be coupled to the support member assembly 300 from the side of the fifth support member 350. The back cover 112 may be coupled to the support member assembly 300 from the side of the third support member 330. At least a portion of the first support member 310, the second support member 320, the third support member 330, the fourth support member 340, or the fifth support member 350 may include a metallic material and/or a non-metallic material (e.g., polymer). According to various embodiments, at least two or more of the first support member 310, the second support member 320, the third support member 330, the fourth support member 340, and the fifth support member 350 may be integrally implemented. According to various embodiments, the support member assembly 300 may refer to a structure including at least some of the first support member 310, the second support member 320, the third support member 330, the fourth support member 340, and the fifth support member 350.

The first support member 310 may include, for example, a first side surface (not illustrated) facing the fourth support member 340, a second side surface 310c facing the fifth support member 350 and located opposite to the first side surface, a third side surface (not illustrated) interconnecting one end of the first side surface and one end of the second side surface 310c, or a fourth side surface 310d interconnecting the other end of the first side surface and the other end of the second side 310c and located opposite to the third side surface. According to an embodiment, the first pulley 360 may be located near the third side surface of the first support member 310. The first pulley 360 may include a cylindrical roller 361 extending in a direction (e.g., +y-axis direction) from the fifth support member 350 to the fourth support member 340. The first pulley 360 may include a first rotation shaft (not illustrated) and a second rotation shaft 363 connected to the roller 361, and the first rotation shaft and the second rotation shaft 363 may be located opposite to each other with the roller 361 interposed therebetween. The first rotation shaft may be located between the roller 361 and the first side cover 113, and may be connected to the fourth support member 340. The second rotation shaft 363 may be located between the roller 361 and the second side cover 114, and may be connected to the fifth support member 350. The fourth support member 340 may include a first through hole 341 into which the first rotation shaft is inserted, and the fifth support member 350 may include a second through hole 351 into which the second rotation shaft 363 is inserted. The roller 361 may be rotatable based on the first rotation shaft disposed on the fourth support member 340 and the second rotation shaft 363 disposed on the fifth support member 350.

According to an embodiment, the sliding plate 120 may be disposed on the support member assembly 300 to be slidable on the first support member 310. For example, a sliding structure for supporting and guiding the coupling and the movement of the sliding plate 120 may be provided between the first support member 310 and the sliding plate 120. According to an embodiment, the sliding structure may include at least one elastic structure 490. When the sliding plate 120 is moved by a set distance by an external force, due to the at least one elastic structure 490, the electronic device 100 may be switched from the closed state of FIG. 1A to the open state of FIG. 2A or from the open state to the closed state without a further external force. The at least one elastic structure 490 may be implemented based on various elastic members such as torsion springs. For example, a torsion spring as the resilient structure 490 may include one end connected to the sliding plate 120, the other end connected to the first support member 310, and a spring portion between the one end and the other end. When the sliding plate 120 is moved by an external force by a set distance in a first direction in which the sliding plate 120 slides out, the position of the one end relative to the other end is changed so that the sliding plate 220 can be moved in the first direction due to the elastic force of the spring portion without a further external force, and thus the electronic device 100 can be switched from the closed state of FIG. 1A to the open state of FIG. 2A. When the sliding plate 120 is moved by an external force by a set distance in a second direction opposite to the first direction, the position of the one end relative to the other end is changed so that the sliding plate 120 can be moved in the second direction due to the elastic force of the spring portion without a further external force, and thus the electronic device 100 can be switched from the open state of FIG. 2A to the closed state of FIG. 2A.

According to an embodiment, the flexible display 130 may include a first section 131 extending from the first bendable section 133. The first section 131 may be disposed on the sliding plate 120. When the electronic device 100 is switched from the closed state of FIG. 1A to the open state of FIG. 2A, due to the movement of the sliding plate 120, the first bendable section 133 connected to the first section 131 moves out of the electronic device 100 in a sliding manner so that the screen can be expanded. When the electronic device 100 is switched from the closed state to the open state, due to the movement of the sliding plate 120, at least a portion of the first bendable section 133 is introduced into the electronic device 100 so that the screen can be contracted. The support member assembly 300 may include an opening (not illustrated) for introducing or pulling-out of the first bendable section 133, and the first pulley 360 may be located in the opening. The opening may include a gap on one side between the first support member 310 and the third support member 330, and a portion 331 of the third support member 330 that is located adjacent to the opening may have a curved shape corresponding to the curved surface of the roller 361. The first pulley 360 may be located to correspond to the first bendable section 133, and the movement and the direction of movement of the first bendable section 133 during the switching between the closed state of FIG. 1A and the open state of FIG. 2A may be guided based on the rotation of the first pulley 360.

According to an embodiment, the support sheet 370 may be attached to the rear surface of the flexible display 130. The rear surface of the flexible display 130 may refer to the surface located opposite to the surface from which light from a light-emitting layer (or a display panel) including a plurality of pixels is emitted. For example, the support sheet 370 may include a second section (not illustrated) that is disposed at least partially along the first section 131, a second bendable section (not illustrated) that is disposed along the first bendable section 133, or a third section (not illustrated) that is spaced apart from the second section with the second bendable section interposed therebetween and does not overlap the flexible display 130. According to various embodiments, at least a portion of the second section or at least a portion of the third section may be omitted. The support sheet 370 may contribute to durability of the flexible display 130. The support sheet 370 may reduce the influence of a load or stress that may occur during switching between the closed state of FIG. 1A and the open state of FIG. 2A, on the flexible display 130. The support sheet 370 may prevent and/or reduce the flexible display 130 from being damaged by a force transmitted from the sliding plate 120 when the sliding plate 120 is moved. Although not illustrated, the flexible display 130 may include a first layer including a plurality of pixels and a second layer coupled to the first layer. The first layer may include, for example, a light-emitting layer including a plurality of pixels implemented with light-emitting elements, such as organic light-emitting diodes (OLEDs) or micro light-emitting diodes (LEDs), and various other layers (e.g., an optical layer for improving the image quality of outdoor visibility of the screen, such as a polarization layer). According to various embodiments, the plurality of pixels may not be disposed in a partial area of the flexible display 130 that at least partially overlaps at least one electronic component (e.g., a camera module or a sensor module) included in the electronic device 100 when viewed from above the screen (e.g., in the −z-axis direction). According to various embodiments, the partial area of the flexible display 130 that at least partially overlaps at least one electronic component (e.g., a camera module or a sensor module) included in the electronic device 100 when viewed from above the screen may include a pixel structure and/or a wiring structure different from those of other areas. For example, the partial area of the flexible display 130 that at least partially overlaps at least one electronic component (e.g., a camera module or a sensor module) may have a pixel density different from that of other areas. For example, the partial area of the flexible display 130 that at least partially overlaps at least one electronic component (e.g., a camera module or a sensor module) may be implemented as a substantially transparent area formed by changing the pixel structure and/or the wiring structure even if the partial area does not include an opening. The second layer may include various layers for supporting and protecting the first layer (e.g., a cushioning member), blocking light, absorbing or blocking electromagnetic waves, or diffusing, dissipating, or radiating heat. According to an embodiment, at least a portion of the second layer is a conductive member (e.g., a metal plate), which may be helpful for reinforcing the rigidity of the electronic device 100, and may be used in order to block ambient noise and to dissipate heat emitted from surrounding heat-emitting components (e.g., a display driving circuit). According to an embodiment, the conductive member may include at least one of copper (Cu), aluminum (Al), stainless steel (SUS), or a CLAD (e.g., a stacked member in which SUS and Al are alternately disposed). The support sheet 370 may cover at least a portion of the second layer of the flexible display 130 and may be attached to the rear surface of the second layer. The support sheet 370 may be formed of various metallic materials and/or non-metallic materials (e.g., polymer). According to an embodiment, the support sheet 370 may include stainless steel. According to various embodiments, the support sheet 370 may include engineering plastic. According to various embodiments, the support sheet 370 may be implemented integrally with the flexible display 130.

According to an embodiment, the multi-bar structure 380 may be connected to the sliding plate 120, and may include a first surface 381 facing the support sheet 370 and a second surface 382 located opposite to the first surface 381. The second surface 382 may be spaced apart from the support sheet 370 with the first surface 381 interposed therebetween. When the sliding plate 120 is moved, the movement and the direction of movement of the multi-bar structure 380 may be guided by the roller 361 rotating in friction with the second surface 382. According to an embodiment, the second surface 382 may include a form in which a plurality of bars (not illustrated) extending in a direction (e.g., +y-axis direction) from the second rotational axis 363 of the first pulley 360 to the first rotational axis (not illustrated) are arranged. The multi-bar structure 380 may be bent at portions having a relatively small thickness between the plurality of bars. In various embodiments, this multi-bar structure 380 may be referred to as various other terms, such as a "flexible track" or a "hinge rail". According to various embodiments, various other types of flexible members substantially serving the same role as the multi-bar structure 380 may be substituted for the multi-bar structure 380.

According to an embodiment, in the closed state of FIG. 1A or the open state of FIG. 2A, at least a portion of the multi-bar structure 380 can be located on the screen side to support the first bendable section 133 of the flexible display 130 such that the first bendable section 133 can maintain a form smoothly connected to the first section 131 of the flexible display 130 without lifting. The multi-bar structure 380 may contribute to enabling the first bendable section 133 to be moved while maintaining the form smoothly connected to the first section 131 without lifting during the switching between the closed state of FIG. 1A and the open state of FIG. 2A.

According to an embodiment, the support sheet 370 may substantially prevent and/or reduce elements positioned inside the electronic device 100 (e.g., the multi-bar structure 380) from being visible through the flexible display 130.

According to an embodiment, the first belt 410 may interconnect the sliding plate 120 and the support sheet 370, and the second pulley 440 may be located on the first support member 310 to correspond to the first belt 410. The second pulley 440 may include a rotation shaft (not illustrated) parallel to the rotation shaft of the first pulley 360 and may be located to be spaced apart from the first pulley 360. The first support member 310 may include an opening (not illustrated) penetrating one surface facing the sliding plate 120 and the other surface facing the second support member 320, and the second pulley 440 may be disposed in the opening. The first belt 410 may be disposed through the opening, wherein one end 411 of the first belt 410 may be connected to the sliding plate 120, and the other end 412 may be connected to the support sheet 370. The second pulley 440 connected to the first belt 410 may guide the movement and the direction of movement of the first belt 410. The second belt 420 and the third pulley 450 located to correspond to the same interconnect the sliding plate 120 and the support sheet 370 at different positions, and may be implemented in substantially the same manner as the first belt 410 and the second pulley 440 located to correspond to the same. The third pulley 450 connected to the second belt 420 may guide the movement and the direction of movement of the second belt 420. The third belt 430 and the fourth pulley 460 located to correspond to the same interconnect the sliding plate 120 and the support sheet 370 at different positions, and may be implemented in substantially the same manner as the first belt 410 and the second pulley 440 located to correspond to the same. The fourth pulley 460 connected to the third belt 410 may guide the movement and the direction of movement of the third belt 410. According to various embodiments, the number or positions of the belts or the corresponding pulleys may vary without being limited to the embodiment of FIG. 3.

According to an embodiment, the sliding plate 120, the multi-bar structure 380, the flexible display 130, the support sheet 370, the first belt 410, the second belt 420, the third belt 430, the first pulley 360, the second pulley 440, the third pulley 450, and the fourth pulley 460 may transfer a motion or force during the switching between the closed state of FIG. 1A and the open state of FIG. 2A. For example, the force for moving the sliding plate 120 on the first support member 310 may cause the movement of the flexible display 130, the movement of the first belt 410, the movement of the second belt 420, and the movement of the third belt 430, the rotation of the first pulley 360, the rotation of the second pulley 440, the rotation of the third pulley 450, and the rotation of the fourth pulley 460. When the sliding plate 120 is moved by a set distance by an external force, due to at least one elastic structure 490, the electronic device 100 may be switched from the closed state of FIG. 1A to the open state of FIG. 2A from the open state to the closed state without a further external force. The force for moving the sliding plate 120 on the first support member 310 may include the external force or a force generated by the elastic structure 490.

According to an embodiment, the first bendable section 133 of the flexible display 130, the second bendable section (e.g., see reference numeral 373 in FIG. 6) of the support sheet 370 that corresponds to the first bendable section 133, and the multi-bar structure 380 may be connected to the first pulley 360. The movement and the direction of movement of the first bendable section 133, the second bendable section, and the multi-bar structure 380 may be guided by the first pulley 360. The multi-bar structure 380 may be in face-to-face contact with the roller 361 of the first pulley 360. The second bendable section of the support sheet 370 may be located between the multi-bar structure 380 and the first bendable section 133 of the flexible display 130. The second bendable section of the support sheet 370 is not in direct face-to-face contact with the first pulley 360, but is moved based on the rotation of the first pulley 360 in a driving relationship with the first pulley 360 to correspond to the multi-bar structure 380. Thus, in the following description, the second bendable section may be described as being in a connected state (or a drivingly connected state) with the first pulley 360. The first bendable section 133 is not in direct face-to-face contact with the first pulley 360, but is moved based on the rotation of the first pulley 360 in a driving relationship with the first pulley 360 to correspond to the multi-bar structure 380 and the second bendable section of the support sheet 370. Thus, in the following description, the first bendable section 133 may be described as being in a connected state (or a drivingly connected state) with the first pulley 360.

According to an embodiment, the first belt 410 may be connected to the second pulley 440 located opposite to the first pulley 360, which is in the drivingly connected state with the first bendable section 133, to provide a tension to the flexible display 130 and the support sheet 370. The second belt 420 may be connected to the third pulley 450 located opposite to the first pulley 360, which is in the drivingly connected state with the first bendable section 133, to provide a tension to the flexible display 130 and the support sheet 370. The third belt 430 may be connected to the fourth pulley 460 located opposite to the first pulley 360, which is in the drivingly connected state with the first bendable section 133, to provide a tension to the flexible display 130 and the support sheet 370. The tension of the first belt 410, the tension of the second belt 420, and/or the tension of the third belt 430 may contribute to forming a screen in which the first bendable section 133 is smoothly connected to the first section 131 without lifting. The tension of the first belt 410, the tension of the second belt 420, and the tension of the third belt 430 may contribute to enabling the first bendable section 133 to be smoothly connected to the first section without lifting with respect to the elasticity of the flexible display 130 and/or the elasticity of the support sheet 370.

According to an embodiment, the third pulley 450 may be located between the second pulley 440 and the fourth pulley 460. The second pulley 440, the third pulley 450, and the fourth pulley 460 may be arranged in a direction (e.g., the +y-axis direction) from the second side cover 114 to the first side cover 113. A distance by which the third pulley 450 is spaced apart from the second pulley 440 in the +y-axis direction may be substantially the same as a distance by which the third pulley 450 is spaced apart from the fourth pulley 460 in the −y-axis direction. According to an embodiment, the third pulley 450 may be located to correspond to the center of the first section 131 or the center of the screen in the y-axis direction. A distance by which the third pulley 450 is spaced apart from the fourth support member 340 in the −y-axis direction may be substantially the same as a distance by which the third pulley 450 is spaced apart from the fifth support member 350 in the +y-axis direction. The second pulley 440, the third pulley 450, and the fourth pulley 460 may be located to be spaced apart from the first pulley 360 by a substantially equal distance. The positions or numbers of the belts or other pulleys located to be spaced apart from the first pulley 360 corresponding to the belt are not limited to the embodiment of FIG. 3 and may vary.

According to various embodiments (not illustrated), one pulley replacing the second pulley 440, the third pulley 450, and the fourth pulley 460 may be implemented. In this case, the pulley may include a groove formed in a circumferential surface thereof for locating the first belt 410, the second belt 420, or the third belt 430.

According to various embodiments, one belt replacing the first belt 410, the second belt 420, and the third belt 430 may be implemented. In this case, one belt and one pulley located to correspond the belt and to be spaced apart from the first pulley 360 may be located to correspond to the center of the first section 131 or the center of the screen in the +y-axis direction.

According to various embodiments, belts or other pulleys located to correspond to the belts and to be spaced apart from the first pulley 360 may be provided in an even number. The plurality of pulleys provided in the even number may be symmetrically arranged with respect to the center of the first section 131 or the center of the screen in the y-axis direction. According to various embodiments, the plurality of pulleys provided in the even number may be arranged at a constant interval in the y-axis direction. According to various embodiments, a distance by which a pulley at one side closest to the fifth support member 350 among the plurality of pulleys provided in the even number is spaced apart from the fifth support member 350 in the +y-axis direction may be substantially the same as a distance by which a pulley at the other side closest to the fourth support member 340 among the plurality of pulleys provided in the even number is spaced apart from the fourth support members 340 in the −y-axis direction.

According to an embodiment, one surface 310*a* of the first support member 310 may include a first recess 310*c* between the first pulley 360 and the second pulley 440, a second recess 310*d* between the first pulley 360 and the third pulley 450, or a third recess 310*e* between the first pulley 360 and the fourth pulley 460. A portion (not illustrated) between one end 411 and the second pulley 440 in the first belt 410 may be disposed in the first recess 310*c*. A portion of the second belt 420 may be disposed in the second recess 310*d* like the first belt 410. A portion of the third belt 430 may be disposed in the third recess 320*e* like the first belt 410.

According to an embodiment, on the printed circuit board 390, a processor, a memory, and/or an interface may be mounted. The processor may include one or more of, for example, a central processing unit, an application processor, a graphics processor, an image signal processor, a sensor hub processor, or a communication processor. The memory may include, for example, a volatile memory or a nonvolatile memory. The interface may include, for example, a high-definition multimedia interface (HDMI), a universal serial bus (USB) interface, an SD card interface, and/or an audio interface. The interface may electrically or physically connect, for example, the electronic device 100 to an external electronic device and may include a USB connector, an SD card/an MMC connector, or an audio connector. The electronic device 100 may include various other elements disposed on the printed circuit board 390 or electrically connected to the printed circuit board 390. For example, the electronic device 100 may include a battery (not illustrated) located between the first support member 310 and the second support member 320 or between the second support member 320 and the back cover 112. A battery (not illustrated) is a device for supplying power to at least one component of the electronic device 100 and may include, for example, a non-rechargeable primary battery, a rechargeable secondary battery, or a fuel cell. The battery (not illustrated) may be integrally disposed inside the electronic device 100, or may be detachably disposed on the electronic device 100. According to an embodiment, the electronic device 100 may include an antenna (not illustrated) located between the first support member 310 and the second support member 320 or between the second support member 320 and the back cover 112. The antenna (not illustrated) may include, for example, a near field communication (NFC) antenna, a wireless charging antenna, and/or a magnetic secure transmission (MST) antenna. The antenna (not illustrated) may perform short-range communication with, for example, an external electronic device, or may transmit/receive power required for charging to/from the external device in a wireless manner. In another embodiment, an antenna structure may be provided by a portion of the first side cover 113 and/or the second side cover 114 or a combination thereof.

According to an embodiment, the electronic device 100 may include a flexible printed circuit board (FPCB) 135 that electrically connects the flexible display 130 and the printed circuit board 390 to each other. For example, the flexible printed circuit board 135 may be electrically connected to the printed circuit board 390 through an opening (not illustrated) provided in the sliding plate 120 and an opening (not illustrated) provided in the first support member 310.

Figure 4:
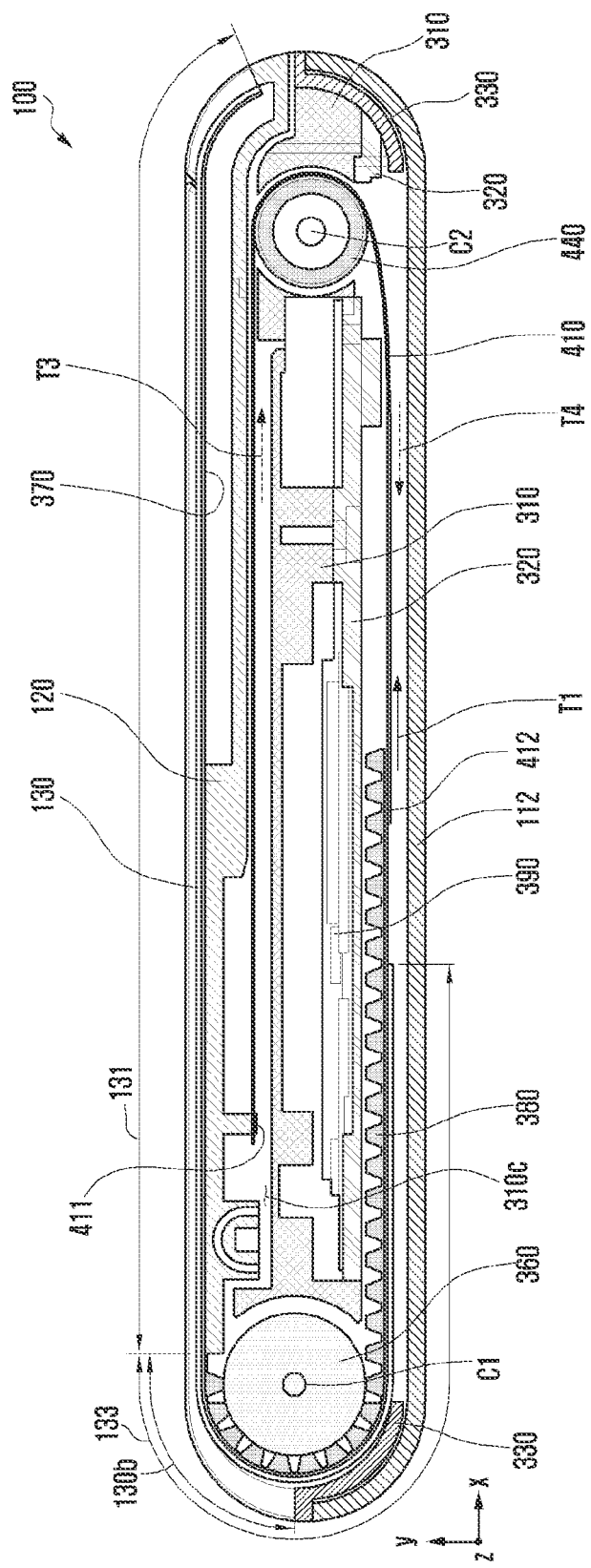
FIG. 4 is a cross-sectional view of the electronic device of FIG. 1A in the closed state taken along line A-A' according to various embodiments.
Figure 5:
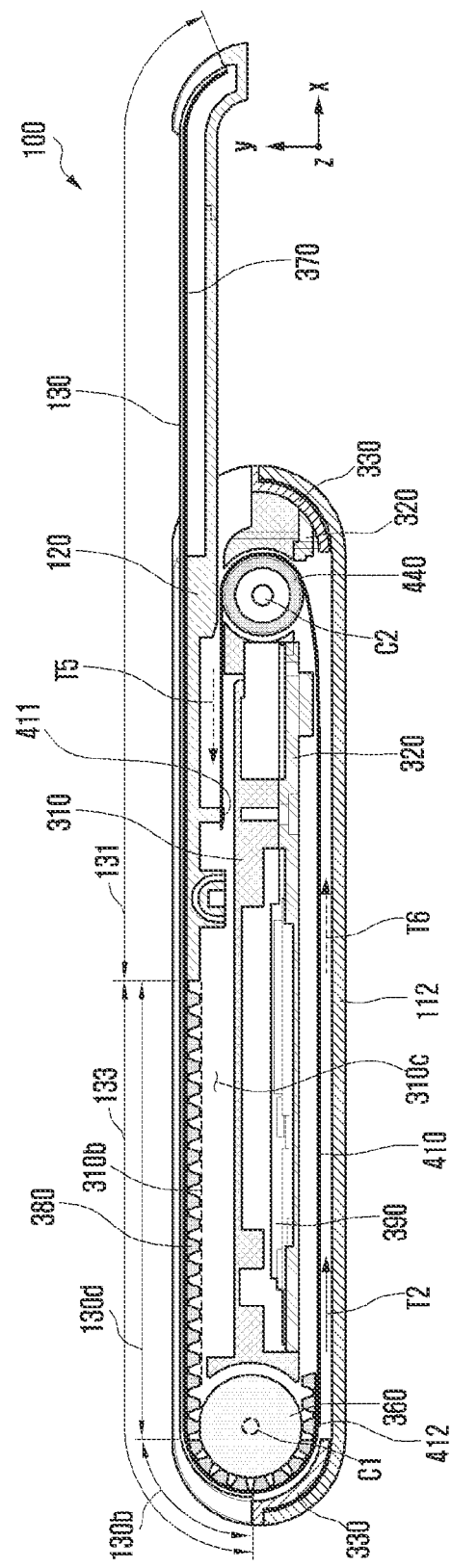
FIG. 5 is a cross-sectional view of the electronic device of FIG. 2A in the open state taken along line B-B' according to various embodiments.

FIG. 4 is a cross-sectional view of the electronic device 100 in the closed state taken along line A-A' of FIG. 1A according to various embodiments. FIG. 5 is a cross-sectional view of the electronic device 100 taken along line B-B' of FIG. 2A in the open state according to various embodiments.

Referring to FIGS. 4 and 5, in an embodiment, the electronic device 100 may include a back cover 112, a first support member 310, a second support member 320, a third support member 330, and sliding plate 120, a flexible display 130, a support sheet 370, a multi-bar structure 380, a printed circuit board 390, a first pulley 360, a second pulley 440, and/or a first belt 410. Redundant descriptions of some of the reference numerals of FIG. 4 or 5 may not be repeated here.

According to an embodiment, the sliding plate 120 may be disposed on the first support member 310 to be capable of sliding out. The flexible display 130 may include a first section 131 overlappingly coupled to the sliding plate 120. The flexible display 130 may include a first bendable section 133 extending from the first section 131, and the first bendable section 133 may be pulled out from the inner space of the electronic device 100 at the time of sliding out of the sliding plate 120. The support sheet 370 may be disposed on the rear surface of the flexible display 130. According to various embodiments, the support sheet 370 may be included in the flexible display 130. The first pulley 360 may be located inside the electronic device 100 and may be connected to the first bendable section 133 of the flexible display 130. The first belt 410 may interconnect the support sheet 370 and the sliding plate 120. For example, one end 411 of the first belt 410 may be connected to the sliding plate 120 between the first support member 310 and the sliding plate 120. The support sheet 370 may include a second section (not illustrated) that is disposed at least partially along the first section 131, a second bendable section (not illustrated) that is disposed along the first bendable section 133, or a third section (not illustrated) that is spaced apart from the second section with the second bendable section interposed therebetween and does not overlap the flexible display 130. The other end 412 of the first belt 410 may be connected to the third section of the support sheet 370. According to an embodiment, the first belt 410 may be connected to the sliding plate 120 through various methods such as bolting, welding, or hook jointing. According to various embodiments, a device capable of adjusting a connection position between the first belt 410 and the support sheet 370 may be implemented. The tension of the first belt 410 may vary depending on the connection position between the first belt 410 and the support sheet 370. According to various embodiments, a device capable of adjusting a connection position between the first belt 410 and the sliding plate 120 may be implemented. The tension of the first belt 410 may vary depending on the connection position between the first belt 410 and the sliding plate 120. The second pulley 440 may have a rotation shaft parallel to the first pulley 360 and may be disposed inside the electronic device 100 to be spaced apart from the first pulley 360 in the slide-out direction (e.g., the +x-axis direction). The second pulley 440 may be connected to the first belt 410. The multi-bar structure 380 may extend from the sliding plate 120 to the space between the support sheet 370 and the first pulley 360. The multi-bar structure 380 may contribute to enabling the first bendable section 133 to be moved while maintaining the form smoothly connected to the first section 131 without lifting during the switching between the closed state of FIG. 4 and the open state of FIG. 5. In the closed state of FIG. 4 or the open state of FIG. 5, a portion of the first bendable section 133 may form a first curved portion 130*b* of the screen, and the first curved portion 130*b* may be supported by the multi-bar structure 380 between the first pulley 360 and the first bendable section 133 to be smoothly connected to the first section without lifting. In the open state of FIG. 5, a portion of the first bendable section 133 may form a partial flat portion 130*d* of the screen, and the flat portion 130*d* may be supported by the multi-bar structure 380 between one surface 310*b* of the first support member 310 (e.g., the area around the first recess 310*c* in the one surface 310*a* in FIG. 3) and the first bendable section 133 to be smoothly connected to the first section 131 without lifting.

According to an embodiment, when the sliding plate 120 is moved, the motion or force may be transferred via the flexible display 130, the support sheet 370, the multi-bar structure 380, the first pulley 360, the first belt 410, and the second pulley 440. For example, the force for moving the sliding plate 120 on the first support member 310 may cause the movement of the flexible display 130, the movement of the first belt 410, the rotation of the first pulley 360, and the rotation of the second pulley 440.

According to an embodiment, in the closed state of FIG. 4 or the open state of FIG. 5, the tensile forces (the tensions of the belt) generated at opposite sides of the first belt 410 with respect to the second pulley 440 are substantially the same. The tensile force T1 of the first belt 410 in the closed state of FIG. 4 or the tensile force T2 of the first belt 410 in the open state of FIG. 5 may contribute to enabling the first bendable section 133 to form a screen smoothly connected to the first section 131 without lifting.

According to an embodiment, the first belt 410 may contribute to enabling the first bendable section 133 to be moved while maintaining the form smoothly connected to the first section 131 without lifting during the switching between the closed state of FIG. 4 and the open state of FIG. 5.

For example, when the electronic device 100 is switched from the closed state of FIG. 4 to the open state of FIG. 5, the sliding plate 120 may move on the first support member 310 in the +x-axis direction. With reference to the second pulley 440, a relaxation-side tension T3 may be generated at one side of the first belt 410 connected to the sliding plate 120, and a tension-side tension (or tensile-side tension) T4 may be generated at the other side of the first belt 410 connected to the support sheet 370. According to an embodiment, the relaxation-side tension T3 and the tension-side tension T4 may be generated to minimize and/or reduce the load applied to the rotation shaft C1 of the first pulley 360 and the rotation shaft C2 of the second pulley 440 while making the first bendable section 133 movable while maintaining the shape smoothly connected to the first section 131 without lifting.

For example, when the electronic device 100 is switched from the open state of FIG. 5 to the closed state of FIG. 4, the sliding plate 120 may move on the first support member 310 in the −x-axis direction. With reference to the second pulley 440, a tension-side tension T5 may be generated at one side of the first belt 410 connected to the sliding plate 120, and a relaxation-side tension T6 may be generated at the other side of the first belt 410 connected to the support sheet 370. According to an embodiment, the tension-side tension T5 and the relaxation-side tension T6 may be generated to minimize and/or reduce the load applied to the rotation shaft C1 of the first pulley 360 and the rotation shaft C2 of the second pulley 440 while making the first bendable section 133 movable while maintaining the shape smoothly connected to the first section 131 without lifting.

According to an embodiment, the stress acting on the first belt 410 may include stress due to tension (tensile stress) or stress due to bending (bending stress). The tensile stress may be, for example, proportional to the tensile force acting on the first belt 410 and inversely proportional to the cross-sectional area of the first belt 410. The bending stress may be proportional to, for example, the vertical elastic coefficient (the degree of resistance to tension or compression) of the first belt 410 and/or the thickness of the first belt 410 and may be inversely proportional to the diameter of the second pulley 440. In order to prevent and/or reduce breakage of the first belt 410 during the switching between the closed state of FIG. 4 and the open state of FIG. 5, the shape or material of the first belt 410 may be selected in consideration of such tensile stress or bending stress. According to an embodiment, the first belt 410 may include stainless steel and may be implemented in the form of a thin belt.

According to various embodiments, the second belt 420 or the third belt 430 of FIG. 3 may be implemented substantially the same as the first belt 410. The third pulley 450 or the fourth pulley 460 of FIG. 3 may be implemented substantially the same as the second pulley 420. The interactive operation between the second belt 420 and the third pulley 450 and the interactive operation between the third belt 430 and the fourth pulley 460 may be made to be substantially the same as the interactive operation between the first belt 410 and the second pulley 440.

According to various embodiments (not illustrated), a first curved member including a first curved portion with which the multi-bar structure 380 comes into contact may be disposed in place of the first pulley 360. For example, during the switching between the closed state of FIG. 4 and the open state of FIG. 5, the multi-bar structure 380 may be slid relative to the first curved portion. According to various embodiments, in order to reduce the frictional force between the first curved portion and the multi-bar structure 380, the surface of the first curved portion or the surface of the multi-bar structure 380 may be surface-treated. According to various embodiments, the first curved member may be connected to the support structure 300 of FIG. 3. According to various embodiments, the first pulley 360 may include a first curved member implemented to be rotatable based on friction with the multi-bar structure 380. According to various embodiments (not illustrated), a rail portion (not illustrated) for guiding the movement of the multi-bar structure 380 may be implemented by replacing the first curved member or by being formed along the curved portion of the first curved member. The rail portion may be formed in, for example, the housing 110 of FIG. 1A or the support member structure 300 of FIG. 3. According to an embodiment, the fourth support member 340 may include a first rail portion for guiding the movement of the multi-bar structure 380 by inserting one side portion of the multi-bar structure 380 into the first rail portion. The fifth support member 350 may include a second rail portion for guiding the movement of the multi-bar structure 380 by inserting the other side portion of the multi-bar structure 380 into the second rail portion.

According to various embodiments (not illustrated), a second curved member including a second curved portion with which the first belt 410 comes into contact may be disposed in place of the second pulley 440. For example, during the switching between the closed state of FIG. 4 and the open state of FIG. 5, the first belt 410 may be slid relative to the second curved portion. According to various embodiments, in order to reduce the frictional force between the second curved portion and the first belt 380, the surface of the second curved portion or the surface of the multi-bar structure 380 may be surface-treated. According to various embodiments, the second curved member may be connected to the support structure 300 of FIG. 3. According to various embodiments, the second pulley 440 may include the second curved member implemented to be rotatable based on friction with the first belt 440.

According to various embodiments, a third curved member with which the second belt 420 comes into contact may be disposed in place of the third pulley 450 of FIG. 3. The third curved member may be connected to the support structure 300 of FIG. 3. According to various embodiments, the third pulley 440 may include the third curved member implemented to be rotatable based on friction with the second belt 450.

According to various embodiments, a fourth curved member with which the third belt 430 comes into contact may be disposed in place of the fourth pulley 460 of FIG. 4. The fourth curved member may be connected to the support structure 300 of FIG. 4. According to various embodiments, the fourth pulley 460 may include the fourth curved member implemented to be rotatable based on friction with the third belt 460.

Figure 6:
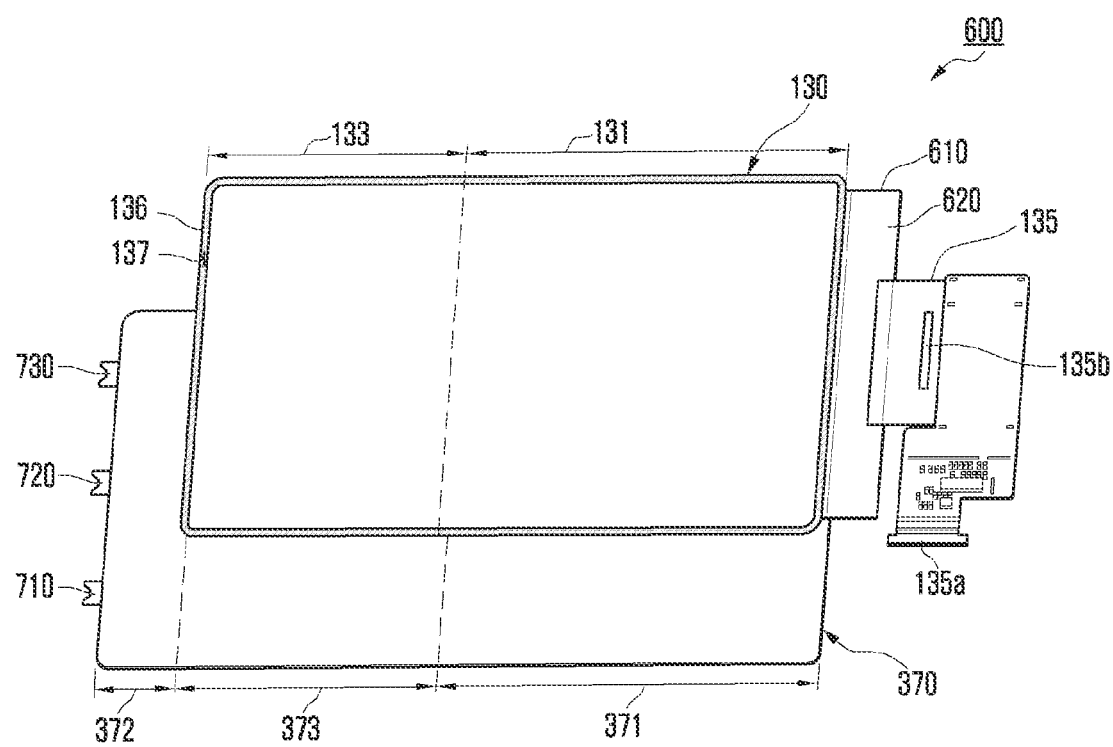
FIG. 6 is an exploded perspective view of a display assembly according to various embodiments.
Figure 7A:
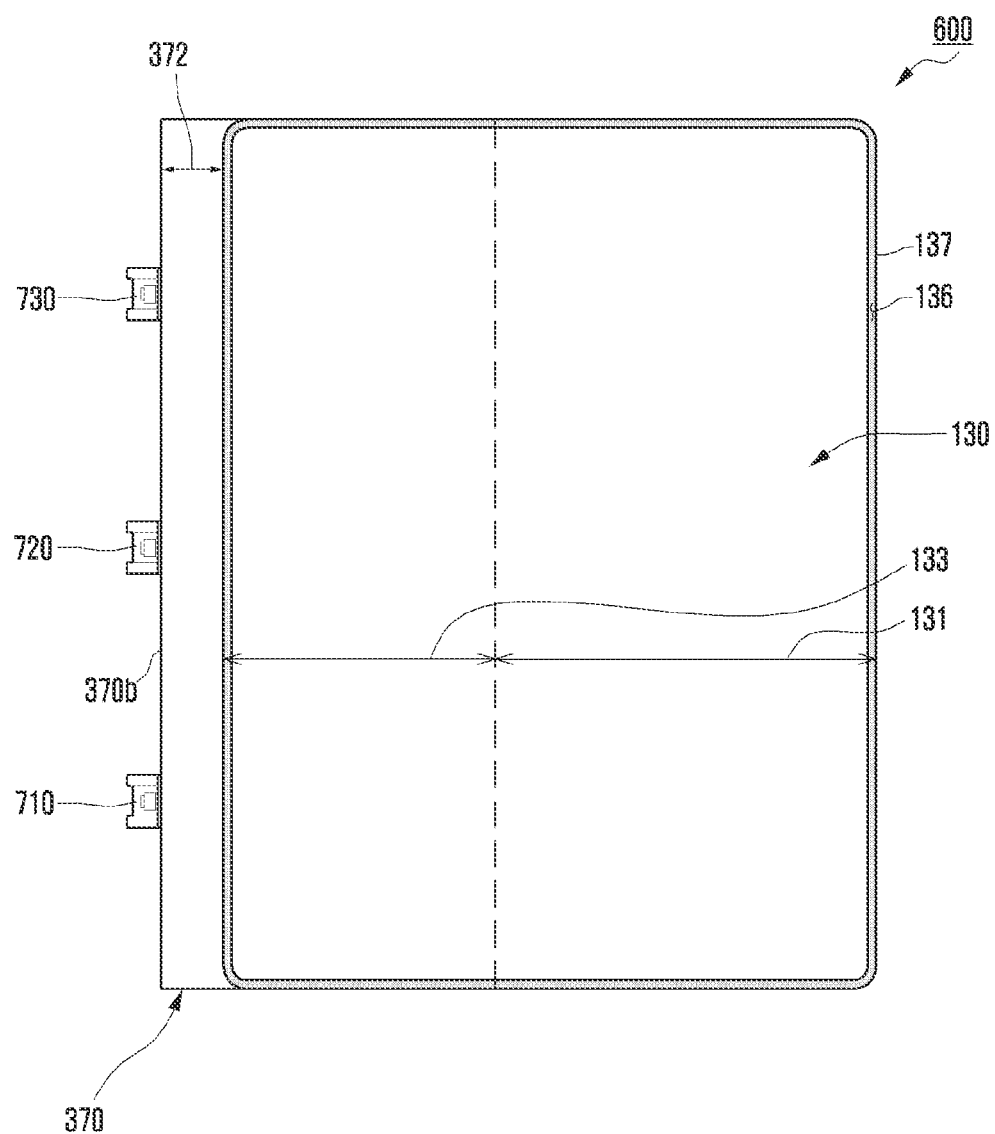
FIG. 7A is a diagram illustrating the front surface of the display assembly of FIG. 6 when the display assembly is in an unfolded state according to various embodiments.
Figure 7B:
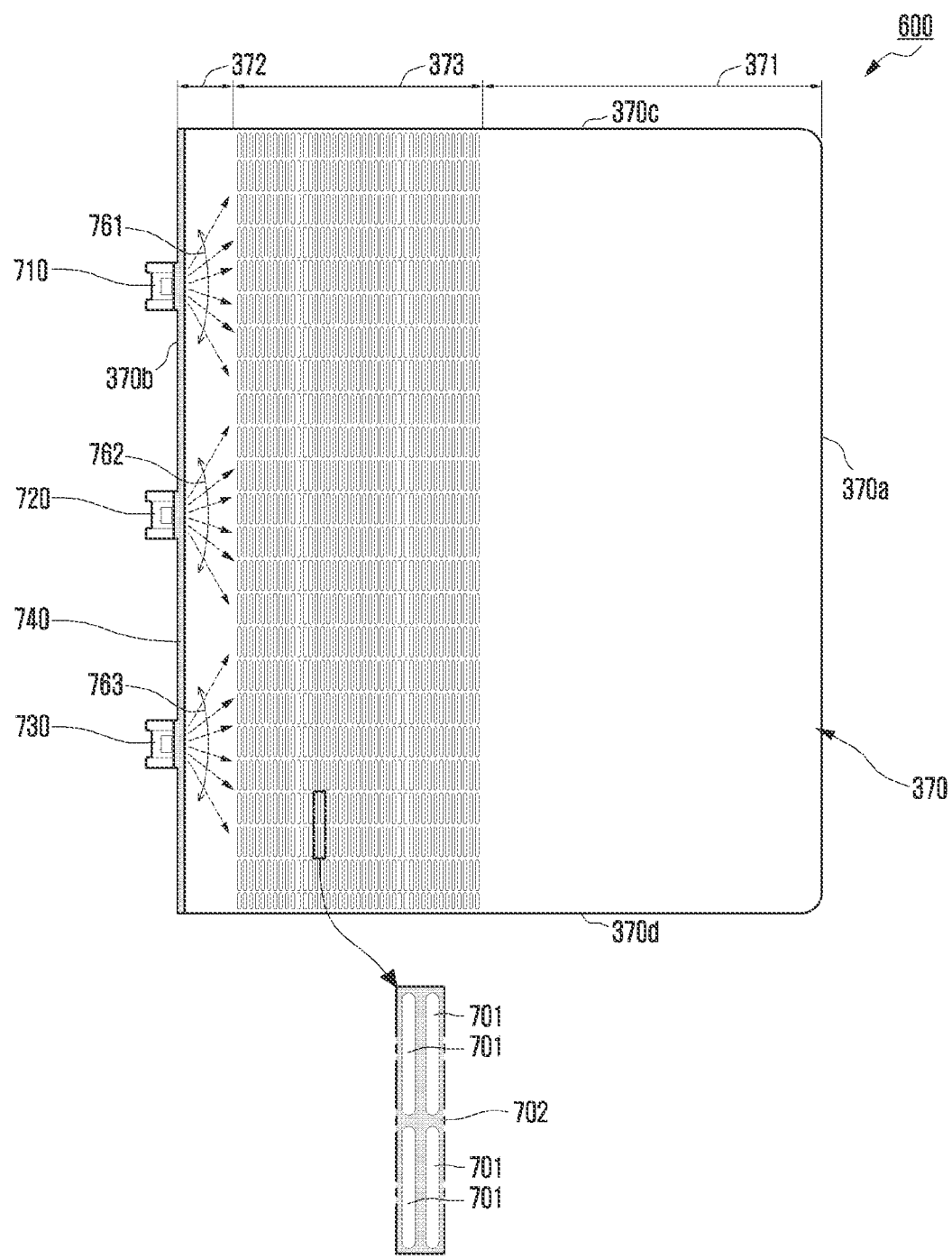
FIG. 7B is a diagram illustrating the rear surface of the display assembly of FIG. 6 when the display assembly is in the unfolded state according to various embodiments.

FIG. 6 is an exploded perspective view of a display assembly 600 according to various embodiments. FIG. 7A is a diagram illustrating the front surface of the display assembly 600 of FIG. 6 when the display assembly 600 is in the unfolded state according to various embodiments. FIG. 7B is a diagram illustrating the rear surface of the display assembly 600 when the display assembly 600 of FIG. 6 is in the unfolded state according to various embodiments.

Referring to FIG. 6, in an embodiment, the display assembly 600 may include a flexible display 130, a support sheet 370 disposed on the flexible display 130, and/or a flexible printed circuit board 135 electrically interconnecting the flexible display 130 and the printed circuit board 390 of FIG. 3.

According to an embodiment, the flexible display 130 may be implemented based on a substrate (e.g., a plastic substrate) 610 formed of a flexible material such as polyimide. Various layers such as a light-emitting layer and an optical layer may be disposed on the substrate 610 through a series of processes such as deposition, patterning, and etching. The substrate 610 may be referred to as a "backplane" or a "backplane substrate". A portion 620 of the substrate 610 may extend to the outside of the screen and may be electrically connected to the flexible printed circuit board 135. For example, the flexible printed circuit board 135 may be electrically connected to an extension 620 of the substrate 610 based on anisotropic conductive film (ACF) bonding. The flexible printed circuit board 135 may be electrically connected to the extension 620 of the substrate 610 through various other methods (e.g., connection between connectors). One end (not illustrated) of the flexible printed circuit board 135 may be electrically connected to the extension 620 of the substrate 610, and the other end (not illustrated) of the flexible printed circuit board 135 may be electrically connected to the printed circuit board 390 illustrated in FIG. 3, 4 or 5. The flexible printed circuit board 135 may include a connector 135a for electrically connecting the flexible printed circuit board 135 to the printed circuit board 390.

According to an embodiment, a display drive circuit (e.g., a display drive integrated circuit (DDI)) 135b electrically connected to the light-emitting layer may be disposed on the flexible printed circuit board 135. A processor (e.g., an application processor (AP)) may be disposed on the printed circuit board 390 of FIG. 3, 4, or 5, and a signal commanded by the processor may be transmitted to the display drive circuit 135b via the flexible printed circuit board 135.

According to an embodiment, the flexible display 130 may be based on OLEDs, and may include an encapsulation layer disposed between the light-emitting layer and the optical layer (e.g., a circular polarization layer). The encapsulation layer may seal the light-emitting layer such that oxygen and/or moisture do not penetrate into the OLEDs. The encapsulation layer may be implemented as, for example, thin-film encapsulation (TFE). According to various embodiments, the flexible display 130 may include a conductive pattern such as a metal mesh (e.g., an aluminum metal mesh) as a touch-sensitive circuit disposed on the encapsulation layer between the encapsulation layer and the optical layer. For example, in response to the bending of the flexible display 130, the metal mesh may have greater durability than a transparent conductive layer made of ITO.

According to an embodiment, the flexible display 130 may include a first section 131 and a first bendable section 133 extending from the first section 131. The support sheet 370 may include a second section 371, a third section 372, and/or a second bendable section 373. The second section 371 may be at least partially disposed along the first section 131. The second bendable section 373 may be at least partially disposed along the first bendable section 133. The third section 372 may not overlap the flexible display 130 by being spaced apart from the second section 371 with the second bendable section 373 interposed therebetween.

According to an embodiment, the display assembly 600 may include a first fastening part 710, a second fastening part 720, and/or a third fastening part 730 disposed in the third section 372. The first fastening part 710 may be connected to the first belt 410 of FIG. 3. The second fastening part 720 may be connected to the second belt 420 of FIG. 3, and may be located between the first fastening part 710 and the third fastening part 730. The third fastening part 730 may be connected to the third belt 430 of FIG. 3. Referring to FIG. 7B, the support sheet 370 may include a first edge 370a, a second edge 370b, a third edge 370c, and/or a fourth edge 370d. The second edge 370b may extend opposite to the first edge 370a and may be substantially parallel to the first edge 370a. The third edge 370c may interconnect one end of the first edge 370a and one end of the second edge 370b. The fourth edge 370d may interconnect the other end of the first edge 370a and the other end of the second edge 370b, and may be substantially parallel to the third edge 370c. The first fastening part 710, the second fastening part 720, and the third fastening part 730 may be located adjacent to the second edge 370b. According to an embodiment, the distance between the first fastening part 710 and the second fastening part 720 may be substantially the same as the distance between the second fastening part 720 and the third fastening part 730.

According to various embodiments, the connection position between the support sheet 370 and the first belt 410 of FIG. 3 is adjustable. The connection position between the support sheet 370 and the second belt 420 of FIG. 3 is adjustable. The connection position between the support sheet 370 and the third belt 430 of FIG. 3 is adjustable. The connection position between the support sheet 370 and a belt (e.g., the first belt 410, the second belt 420, or the third belt 430) is adjustable such that the tension applied to the support sheet 370 is within a threshold range. When the tension applied to the flexible display 130 and the attached support sheet 370 is in the threshold range, the first bendable section 133 can be maintained in a shape smoothly connected to the first section 131 without lifting in the closed state of FIG. 1A or the open state of FIG. 2A. When the tension applied to the flexible display 130 and the attached support sheet 370 is in the threshold range, the first bendable section 133 can be moved while maintaining the shape smoothly connected to the first section 131 without lifting during the switching between the closed state of FIG. 1A and the open state of FIG. 2A. When the tension applied to the flexible display 130 and the attached support sheet 370 is in the threshold range, the slide operation can be smoothly performed during the switching between the closed state of FIG. 1A and the open state of FIG. 2A.

For example, due to the connection position between the support sheet 370 and a belt (e.g., the first belt 410, the second belt 420, or the third belt 430), the tension applied to the flexible display 130 and the attached support sheet 370 may be lower than the threshold range. In this case, due to the elasticity of the flexible display 130 and/or the elasticity of the support sheet 370, the first bendable section 133 may lift or may not be smoothly connected to the first section 131.

As another example, due to the connection position between the support sheet 370 and a belt (e.g., the first belt 410, the second belt 420, or the third belt 430), the tension applied to the flexible display 130 and the attached support sheet 370 may be higher than the threshold range. In this case, the first bendable section 133 may be smoothly connected to the first section 131 without lifting, but it may be difficult to smoothly perform the slide operation during the switching between the closed state of FIG. 1A and the open state of FIG. 2A. When the tension applied to the flexible display 130 and the attached support sheet 370 is higher than the threshold range, the load applied to the rotation shaft of a pulley (e.g., the first pulley 360, the second pulley 440, the third pulley 450, or the sixth pulley 460) may exceed a threshold value and may increase the resistance to rotation of the pulley, thereby making it difficult to perform a smooth and gentle slide operation.

According to an embodiment, the second bendable section 373 may include a lattice structure 702 including a plurality of openings (or a plurality of slits) 701 (see FIG. 7B). For example, the plurality of openings 701 may be provided periodically, may have substantially the same shape, and may be repeatedly arranged at regular intervals. The second bendable section 373 may be more flexible than the second section 371 or the third section 372 due to the lattice structure 702. The lattice structure 702 may contribute to the flexibility of the second bendable section 373. The lattice structure 702 of the second bendable section 373 is not limited to the embodiment of FIG. 7B and may be implemented in various other forms. According to various embodiments, the support sheet 470 may include a recess pattern (not illustrated) including a plurality of recesses in place of the lattice structure 702, wherein the recess pattern may contribute to flexibility of the flexible display 130. According to various embodiments (not illustrated), the lattice structure 702 or the recess pattern may further extend to at least a portion of the second section 371.

According to an embodiment, the support sheet 370 may make elements located inside the electronic device 100 substantially invisible through the flexible display 130 of FIG. 4 or FIG. 5. For example, the lattice structure 702 of the second bendable section 373 includes a plurality of openings 701, but is capable of transmitting light at a level at which the multi-bar structure 380 is substantially invisible through the flexible display 130. According to various embodiments, the lattice structure 702 of the second bendable structure 373 includes a plurality of openings 701, but is also capable of preventing and/or reducing a phenomenon in which the plurality of bars of the multi-bar structure 380 are seen as protruding through the flexible display 130.

According to an embodiment, the display assembly 600 may include a support 740 (see FIG. 7B) connected to the first fastening part 710, the second fastening part 720, and the third fastening part 730. The support 740 may be disposed adjacent to the second edge 370b of the support sheet 370 and may extend along the second edge 370b. According to an embodiment, the support 740 may be a reinforcing substrate having rigidity, and the tension of the first belt 410 (see FIG. 3) connected to the first fastening part 710 may be distributed without being concentrated in a local area of the support sheet 370 due to the support 740 (see reference numeral "761"). The tension of the second belt 420 (see FIG. 3) connected to the second fastening part 720 may be distributed without being concentrated in a local area of the support sheet 370 due to the support 740 (see reference numeral "762"). The tension of the third belt 430 (see FIG. 3) connected to the third fastening part 730 may be distributed without being concentrated in a local area of the support sheet 370 due to the support 740 (see reference numeral "763").

According to various embodiments, the support 740 may be integrated with the first fastening part 710, the second fastening part 720, and the third fastening part 730, and the support and the fastening parts may include the same material as each other. According to various embodiments, the support 740 may be integrated with the support sheet 370 and the support and the support sheet may include the same material. According to various embodiments, the support 740 may be implemented as a portion of the support sheet 370. For example, the support 740 may be implemented in a structure (e.g., a hemming structure) in which a portion of the support sheet 370 is folded.

Referring to FIGS. 6 and 7A, in an embodiment, the flexible display 130 may include a bezel area 137 provided adjacent to and along the edge 136 of the flexible display 130. The bezel area 137 may not include pixels implemented with light emitting elements such as OLEDs, and may include, for example, black or a black-based material having a relatively low light transmittance. The bezel area 137 may be formed through various methods such as coating or printing a light shielding material on the transparent cover forming the front surface of the flexible display 130. Referring to the open state of FIG. 2A, the bezel area 137 may be placed between a screen and a mechanical structure in a slide-out state around the screen to contribute to the aesthetics of the electronic device 100. In an embodiment, referring to the closed state of FIG. 1A, a bezel area may not be present at the opening (not illustrated) side for introducing or pulling-out of the first bendable section 133, but in various embodiments, a bezel area may be implemented at the boundary between the first section 131 and the first bendable section 133 in a software manner. The software-type bezel area may be implemented by, for example, not activating a partial area of the flexible display 130 or using an image displayed on a partial area of the flexible display 130. According to various embodiments, the flexible display 130 may be implemented such that the bezel area 137 is minimized or there is substantially no bezel area 137. In this case, the mechanical structure around the screen may be implemented in a slim form factor that can slide out without degrading aesthetics, or in some cases, the bezel area may be implemented in a software manner for the closed state of FIG. 1A or the open state of FIG. 2A. According to various embodiments, a signal line of the flexible display 130 and/or a touch screen panel (TSP) electrode may be disposed in the bezel area 137.

Figure 8:
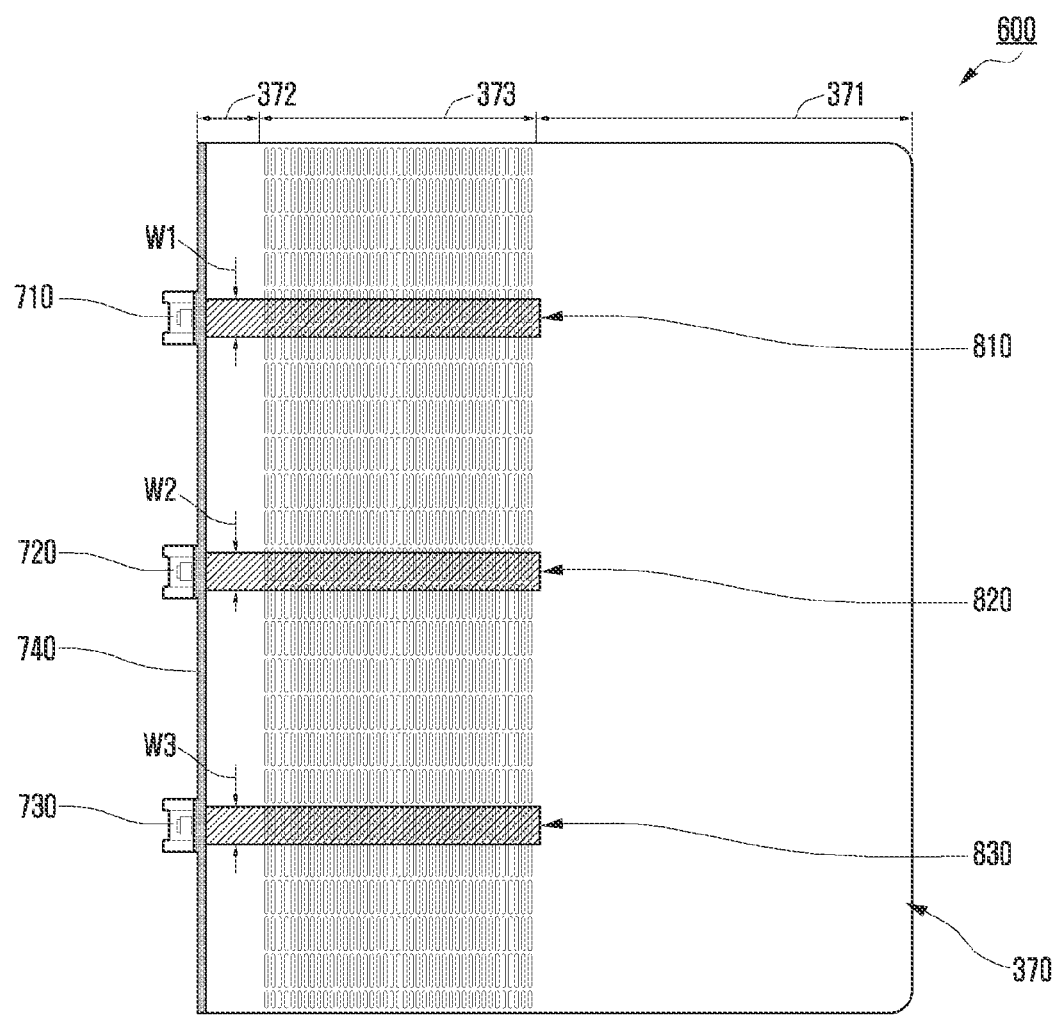
FIG. 8 is a diagram illustrating the rear surface of the display assembly of FIG. 6 when the display assembly is in the unfolded state according to various embodiments.

FIG. 8 is a diagram illustrating the rear surface of the display assembly 600 of FIG. 6 when the display assembly 600 is in the unfolded state according to various embodiments.

Referring to FIG. 8, in an embodiment, the display assembly 600 may include a first reinforcing sheet 810, a second reinforcing sheet 820, and/or a third reinforcing sheet 830 attached to the support sheet 370 and extending from the second section 371 to the third section 372 across the second bendable section 373. A redundant description of some of the reference numerals in FIG. 8 may not be repeated here. When a tensile force is applied to the support sheet 370, the second section 371 or the third section 373 is not stretched, but the second bendable section 373 may be stretched due to the lattice structure 702 of FIG. 7B. According to an embodiment, the first reinforcing sheet 810, the second reinforcing sheet 820, and the third reinforcing sheet 830 may prevent and/or reduce the second bendable section 373 from stretching. The first reinforcing sheet 810, the second reinforcing sheet 820, and the third reinforcing sheet 830 may prevent and/or reduce the second bendable section 373 from stretching due to the lattice structure 702 of FIG. 7B so that the tension of the first belt 410, the tension of the second belt 420, and the tension of the third belt 430 are not reduced. For this reason, the first bendable section 133 of FIG. 4 or 5 may be maintained in a shape smoothly connected to the first section 131 without lifting.

According to an embodiment, the first reinforcing sheet 810, the second reinforcing sheet 820, or the third reinforcing sheet 830 may be bonded to the second section 371 and/or the third section 372 in at least a portion through a method such as welding. According to various embodiments, the first reinforcing sheet 810, the second reinforcing sheet 820, or the third reinforcing sheet 830 may be additionally bonded to the second bendable section 373. According to various embodiments, in order to reduce a degradation in flexibility of the second bendable section 373, the first reinforcing sheet 810, the second reinforcing sheet 820, or the third reinforcing sheet 830 may not be bonded to the second bendable section 373 or may be bonded in a manner of minimizing and/or reducing the bonding area.

The first reinforcing sheet 810 may extend, for example, from the second section 371 to the third section 372 across the second bendable section 373 between the first fastening part 710 and the second section 371. According to various embodiments, the first reinforcing sheet 810 may be connected to the support 740. The first reinforcing sheet 810 may prevent and/or reduce the stretching of the second bendable section 373 by providing a bearing force (e.g., tensile stress) resisting the tension of the first belt 410 (see FIG. 3) connected to the first fastening part 710, to the second bendable section 373.

The second reinforcing sheet 820 may extend, for example, from the second section 371 to the third section 372 across the second bendable section 373 between the second fastening part 720 and the second section 371. According to various embodiments, the second reinforcing sheet 820 may be connected to the support 740. The second reinforcing sheet 820 may prevent and/or reduce the stretching of the second bendable section 373 by providing a bearing force (e.g., tensile stress) resisting the tension of the second belt 420 (see FIG. 3) connected to the second fastening part 720, to the second bendable section 373.

The third reinforcing sheet 830 may extend, for example, from the second section 371 to the third section 372 across the second bendable section 373 between the third fastening part 730 and the second section 371. According to various embodiments, the third reinforcing sheet 830 may be connected to the support 740. The third reinforcing sheet 830 may prevent and/or reduce the stretching of the second bendable section 373 by providing a bearing force (e.g., tensile stress) resisting the tension of the third belt 430 (see FIG. 3) connected to the third fastening part 730, to the second bendable section 373.

According to an embodiment, the first reinforcing sheet 810, the second reinforcing sheet 820, or the third reinforcing sheet 830 may be implemented to support smooth bending of the first bendable section 133 (see FIG. 4 or 5) of the flexible display 130 and smooth bending of the second bendable section 373 of the support sheet 370 based on the tension of the first belt 410, the tension of the second belt 420, and the tension of the third belt 430, as well as to have durability to resist the tensions. For example, the first reinforcing sheet 810, the second reinforcing sheet 820, and the third reinforcing sheet 830 may not substantially stretch due to the tension of the first belt 410, the tension of the second belt 420, and the tension of the third belt 430.

According to an embodiment, when a belt (e.g., the first belt 410, the second belt 420, or the third belt 430) interconnecting the sliding plate 120 of FIG. 3 coupled to the second section 371 of the support sheet 370 and a fastening part (e.g., the first fastening part 710, the second fastening part 720, or the third fastening part 730) of the support sheet 370 provides a tension in a threshold range, the first reinforcing sheet 810, the second reinforcing sheet 820 and/or the third reinforcing sheet 830 may contribute to preventing and/or reducing the tension from being lost in the second bendable section 373 between the second section 371 and the third section 372. The tension in the threshold range is capable of making the first bendable section 133 maintain a shape smoothly connected to the first section 131 without lifting in the closed state of FIG. 4 or the open state of FIG. 5. The tension in the threshold range is capable of making the first bendable section 133 move while maintaining a shape smoothly connected to the first section 131 without lifting during the switching between the closed state of FIG. 4 and the open state of FIG. 5. The tension in the threshold range is capable of contributing to a smooth and gentle slide motion during the switching between the closed state of FIG. 4 and the open state of FIG. 5.

According to an embodiment, the width (W1, W2, or W3) and/or the thickness (not illustrated) of each reinforcing sheet (e.g., the first reinforcing sheet 810, the second reinforcing sheet 820, or the third reinforcing sheet 830) may be determined such that the elasticity of the reinforcing sheet does not interfere with making the first bendable section 133 (FIG. 4 or 5) smoothly connected to the first section 131 (FIG. 4 or 5) without lifting. According to an embodiment, the first reinforcing sheet 810, the second reinforcing sheet 820, or the third reinforcing sheet 830 may include stainless steel and may have a thickness of about 0.01 mm to about 0.2 mm (not illustrated). For example, the first reinforcing sheet 810, the second reinforcing sheet 820, or the third reinforcing sheet 830 may have a thickness of about 0.05 mm or about 0.1 mm. The first reinforcing sheet 810, the second reinforcing sheet 820, or the third reinforcing sheet 830 may be implemented with various other materials (e.g., engineering plastics) or in various other forms.

Figure 9:
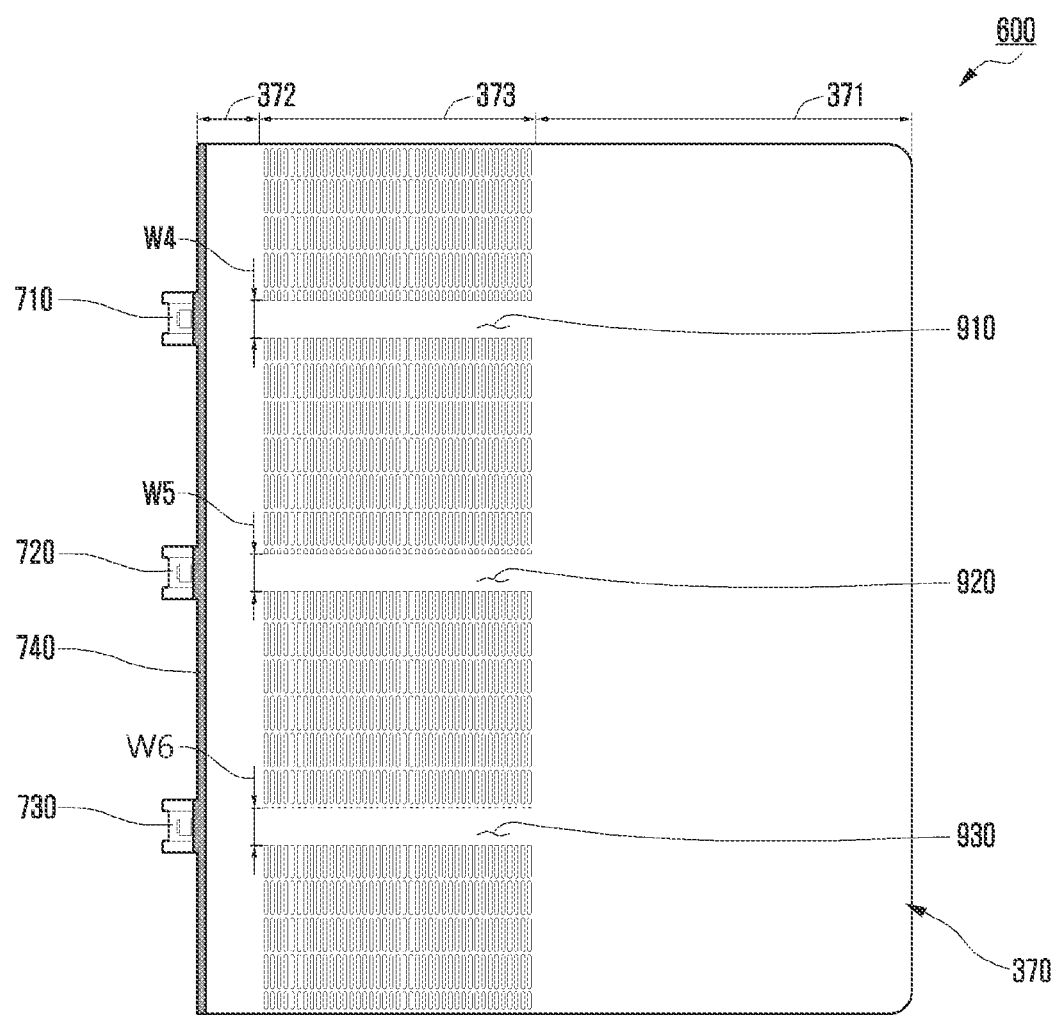
FIG. 9 is a diagram illustrating the rear surface of the display assembly of FIG. 6 when the display assembly is in the unfolded state according to various embodiments.

FIG. 9 is a diagram illustrating the rear surface of the display assembly 600 of FIG. 6 when the display assembly 600 is in the unfolded state according to various embodiments.

A redundant description of some of the reference numerals in FIG. 9 may not be repeated here. Referring to FIG. 9, in an embodiment, in place of the first reinforcing sheet 810 of FIG. 8, the support sheet 370 may include a first area 910 extending from the second section 371 to the third section 372 across the second bendable section 373. In place of the second reinforcing sheet 820 of FIG. 8, the support sheet 370 may include a second area 920 extending from the second section 371 to the third section 372 across the second bendable section 373. In place of the third reinforcing sheet 830 of FIG. 8, the support sheet 370 may include a third area 930 extending from the second section 371 to the third section 372 across the second bendable section 373. The first area 910, the second area 920, and the third area 930 may not include an opening or a lattice structure. When the tension of the first belt 410 (see FIG. 3) connected to the first fastening part 710 acts on the support sheet 370, the first area 910 may prevent and/or reduce the stretching of the second bendable section 373. When the tension of the second belt 420 (see FIG. 3) connected to the second fastening part 720 acts on the support sheet 370, the second area 920 may prevent and/or reduce the stretching of the second bendable section 373. When the tension of the third belt 430 (see FIG. 3) connected to the third fastening part 730 acts on the support sheet 370, the third area 930 may prevent and/or reduce the stretching of the second bendable section 373. The first area 910, the second area 920, and the third area 930 may prevent and/or reduce the stretching of the second bendable section 373 so that the tension of the first belt 410, the tension of the second belt 420, and the tension of the third belt 430 are not reduced. For this reason, the first bendable section 133 of FIG. 4 or 5 may be maintained in a shape smoothly connected to the first section 131 without lifting. The first area 910, the second area 920, and the third area 930 may prevent and/or reduce the stretching of the second bendable section 373 by providing a bearing strength (e.g., tensile stress) resisting the tension of the first belt 410, the tension of the second belt 420, and the tension of the third belt 430, to the second bendable section 373.

According to an embodiment, the first area 910, the second area 920, or the third area 930 may be implemented to support smooth bending of the first bendable section 133 (see FIG. 4 or 5) of the flexible display 130 and smooth bending of the second bendable section 373 of the support sheet 370 based on the tension of the first belt 410, the tension of the second belt 420, and the tension of the third belt 430, as well as to have durability to resist the tensions. For example, the first area 910, the second area 920, and the area 930 may not substantially stretch due to the tension of the first belt 410, the tension of the second belt 420, and the tension of the third belt 430. For example, the width (W4, W5, or W6) and/or the thickness (not illustrated) of the first area 910, the second area 920, or the third area 930 may be determined such that the elasticity of the areas does not interfere with making the first bendable section 133 (FIG. 4 or 5) smoothly connected to the first section 131 (FIG. 4 or 5) without lifting.

According to an embodiment, when a belt (e.g., the first belt 410, the second belt 420, or the third belt 430) interconnecting the sliding plate 120 of FIG. 3 coupled to the second section 371 of the support sheet 370 and a fastening part (e.g., the first fastening part 710, the second fastening part 720, or the third fastening part 730) of the support sheet 370 provides a tension in a threshold range, the first area 910, the second area 920, and/or the third are 930 may contribute to preventing and/or reducing the tension from being lost in the second bendable section 373 between the second section 371 and the third section 372. The tension in the threshold range is capable of making the first bendable section 133 maintain a shape smoothly connected to the first section 131 without lifting in the closed state of FIG. 4 or the open state of FIG. 5. The tension in the threshold range is capable of making the first bendable section 133 move while maintaining a shape smoothly connected to the first section 131 without lifting during the switching between the closed state of FIG. 4 and the open state of FIG. 5. The tension in the threshold range is capable of contributing to a smooth and gentle slide motion during the switching between the closed state of FIG. 4 and the open state of FIG. 5.

Figure 10:
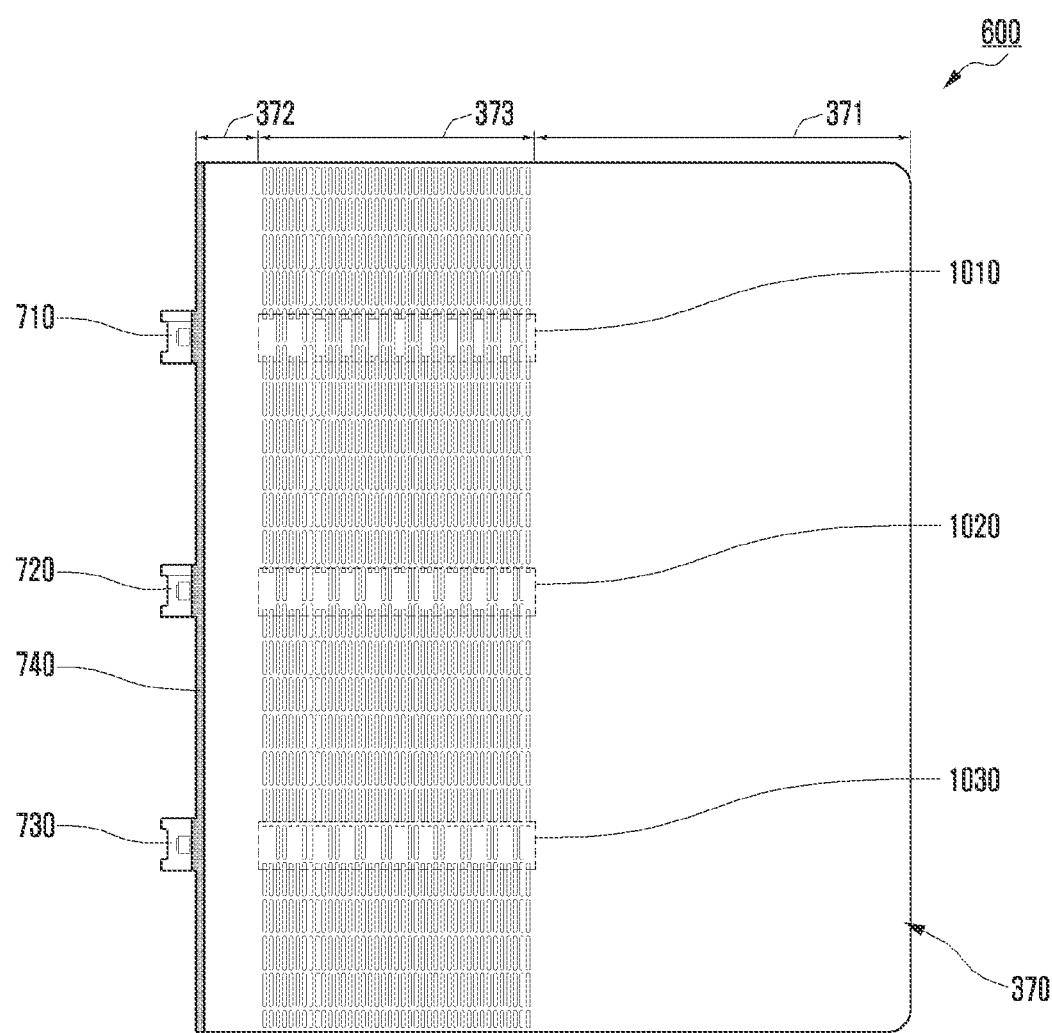
FIG. 10 is a diagram illustrating the rear surface of the display assembly of FIG. 6 when the display assembly is in the unfolded state according to various embodiments.

FIG. 10 is a diagram illustrating the rear surface of the display assembly 600 of FIG. 6 when the display assembly 600 is in the unfolded state according to various embodiments.

A redundant description of some of the reference numerals in FIG. 10 may not be repeated here. Referring to FIG. 10, in an embodiment, in place of the first reinforcing sheet 810 of FIG. 8, the support sheet 370 may be implemented to have a first lattice structure 1010 in which some openings between the first fastening part 710 and the second section 371 are omitted. In place of the second reinforcing sheet 820 of FIG. 8, the support sheet 370 may be implemented to have a second lattice structure 1020 in which some openings between the second fastening part 720 and the second section 371 are omitted. In place of the third reinforcing sheet 830 of FIG. 8, the support sheet 370 may be implemented to have a third lattice structure 1030 in which some openings between the third fastening part 730 and the second section 371 are omitted. When the tension of the first belt 410 (see FIG. 3) connected to the first fastening part 710 acts on the support sheet 370, the first lattice structure 1010 may reduce the stretching of the second bendable section 373. When the tension of the second belt 420 (see FIG. 3) connected to the second fastening part 720 acts on the support sheet 370, the second lattice structure 1020 may reduce the stretching of the second bendable section 373. When the tension of the third belt 430 (see FIG. 3) connected to the third fastening part 730 acts on the support sheet 370, the third lattice structure 1030 may reduce the stretching of the second bendable section 373. The first lattice structure 1010, the second lattice structure 1020, and the third lattice structure 1030 may reduce the stretching of the second bendable section 373 so that the reduction of the tension of the first belt 410, the tension of the second belt 420, and the tension of the third belt 430 can be suppressed. For this reason, the first bendable section 133 of FIG. 4 or 5 may be maintained in a shape smoothly connected to the first section 131 without lifting. The first area 910, the second area 920, and the third area 930 may provide a bearing strength (e.g., tensile stress) resisting the tension of the first belt 410, the tension of the second belt 420, and the tension of the third belt 430, to the second bendable section 373.

According to an embodiment, the first lattice structure 1010, the second lattice structure 1020, or the third lattice structure 1030 may support smooth bending of the first bendable section 133 (see FIG. 4 or 5) of the flexible display 130 and smooth bending of the second bendable section 373 of the support sheet 370 based on the tension of the first belt 410, the tension of the second belt 420, and the tension of the third belt 430, as well as may provide a bearing force resisting the tensions.

According to an embodiment, when a belt (e.g., the first belt 410, the second belt 420, or the third belt 430) interconnecting the sliding plate 120 of FIG. 3 coupled to the second section 371 of the support sheet 370 and a fastening part (e.g., the first fastening part 710, the second fastening part 720, or the third fastening part 730) of the support sheet 370 provides a tension in a threshold range, the first lattice structure 1010, the second lattice structure 1020 and/or the third lattice structure 1030 may contribute to preventing and/or reducing the tension from being lost in the second bendable section 373 between the second section 371 and the third section 372. The tension in the threshold range is capable of making the first bendable section 133 maintain a shape smoothly connected to the first section 131 without lifting in the closed state of FIG. 4 or the open state of FIG. 5. The tension in the threshold range is capable of making the first bendable section 133 move while maintaining a shape smoothly connected to the first section 131 without lifting during the switching between the closed state of FIG. 4 and the open state of FIG. 5. The tension in the threshold range is capable of contributing to a smooth and gentle slide motion during the switching between the closed state of FIG. 4 and the open state of FIG. 5.

Figure 11:
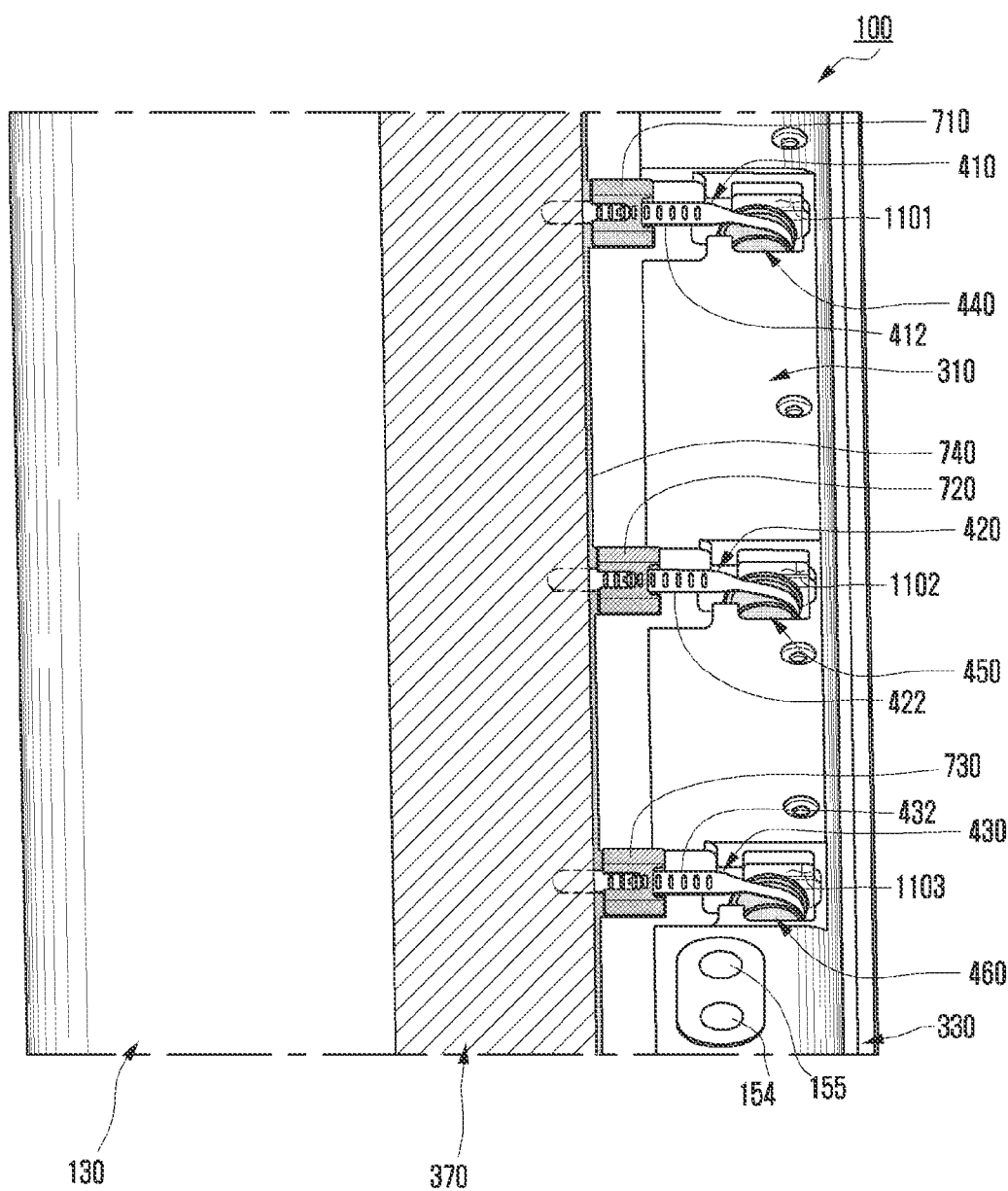
FIG. 11 is a perspective view of a portion of an electronic device according to various embodiments

FIG. 11 is a perspective view illustrating a portion of an electronic device 100 according to various embodiments.

Referring to FIG. 11, in an embodiment, the electronic device 100 may include a first support member 310, a third support member 330, a flexible display 130, a support sheet 370, and a first fastening part 710, a second fastening part 720, a third fastening part 730, a support 740, a first belt 410, a second belt 420, a third belt 430, a second pulley 440, a third pulley 450, a fourth pulley 460, a camera device 154, and/or a flash 155. A redundant description of some of the reference numerals in FIG. 11 may not be repeated here.

According to an embodiment, the first support member 310 may include a first opening 1101, and the second pulley 440 may be disposed in the first opening 1101. The first belt 410 may be disposed through the first opening 1101, wherein one end (not illustrated) of the first belt 410 may be connected to the sliding plate 120 of FIG. 3, and the other end 412 may be connected to the first fastening part 710. The second pulley 440 connected to the first belt 410 may guide the movement and the direction of movement of the first belt 410.

According to an embodiment, the first support member 310 may include a second opening 1102, and the third pulley 450 may be disposed in the second opening 1102. The second belt 420 may be disposed through the second opening 1102, wherein one end (not illustrated) of the second belt 420 may be connected to the sliding plate 120 of FIG. 3, and the other end 422 may be connected to the second fastening part 720. The third pulley 450 connected to the second belt 420 may guide the movement and the direction of movement of the second belt 420.

According to an embodiment, the first support member 310 may include a third opening 1103, and the fourth pulley 460 may be disposed in the third opening 1103. The third belt 430 may be disposed through the third opening 1103, wherein one end (not illustrated) of the third belt 430 may be connected to the sliding plate 120 of FIG. 3, and the other end 432 may be connected to the third fastening part 730. The fourth pulley 460 connected to the third belt 430 may guide the movement and the direction of movement of the third belt 430.

According to an embodiment, a connection position between the first fastening part 710 and the first belt 410, a connection position between the second fastening part 720 and the second belt 420, and/or a connection position between the third fastening part 730 and the third belt 430 may be adjustable. The tension of the first belt 410 may vary depending on the connection position between the first fastening part 710 and the first belt 410. The tension of the second belt 420 may vary depending on the connection position between the second fastening part 720 and the second belt 420. The tension of the third belt 430 may vary depending on the connection position between the third fastening part 730 and the third belt 430.

Figure 12:
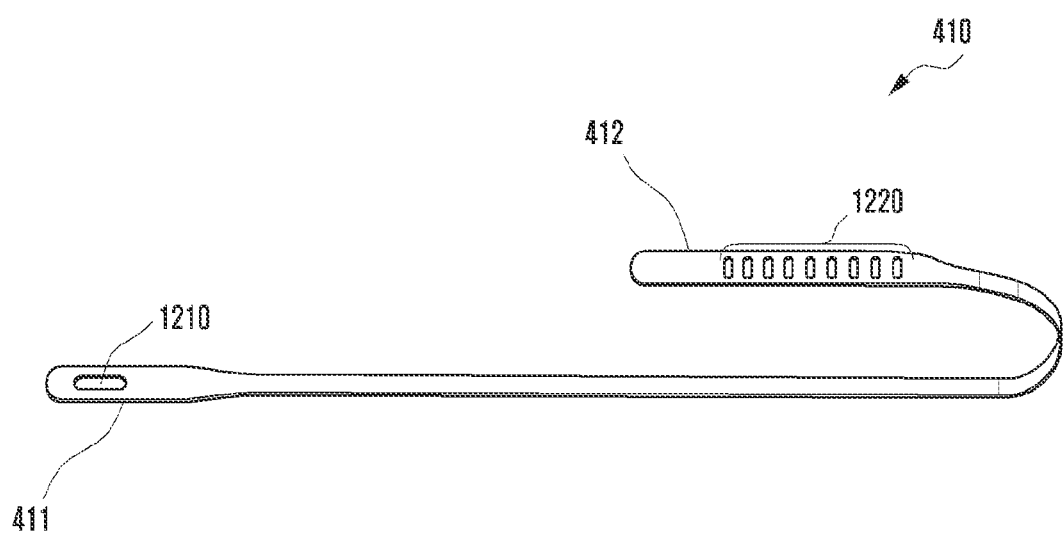
FIG. 12 is a diagram illustrating a first belt of FIG. 11 according to various embodiments.

FIG. 12 is a diagram illustrating the first belt 410 of FIG. 11 according to various embodiments.

Referring to FIG. 12, in an embodiment, one end 411 of the first belt 410 may be connected to the sliding plate 120 of FIG. 3 and may include, for example, a through hole 1210 used for fastening with the sliding plate 120. The other end 412 of the first belt 410 may be connected to the first fastening part 710 of FIG. 11, and may include, for example, a plurality of fastening holes 1220 used for fastening with the first fastening part 710. The plurality of fastening holes 1220 may be arranged in the longitudinal direction of the first belt 410.

The first belt 410 may be implemented, for example, in the form of a thin belt. The second belt 420 or the third belt 430 of FIG. 11 may be implemented to be substantially the same as or similar to the first belt 410. According to various embodiments (not illustrated), the first belt 410, the second belt 420, or the third belt 430 may be implemented as a wire type or a chain type. The first belt 410, the second belt 420, or the third belt 430 may be implemented in various other forms.

Figure 13A:
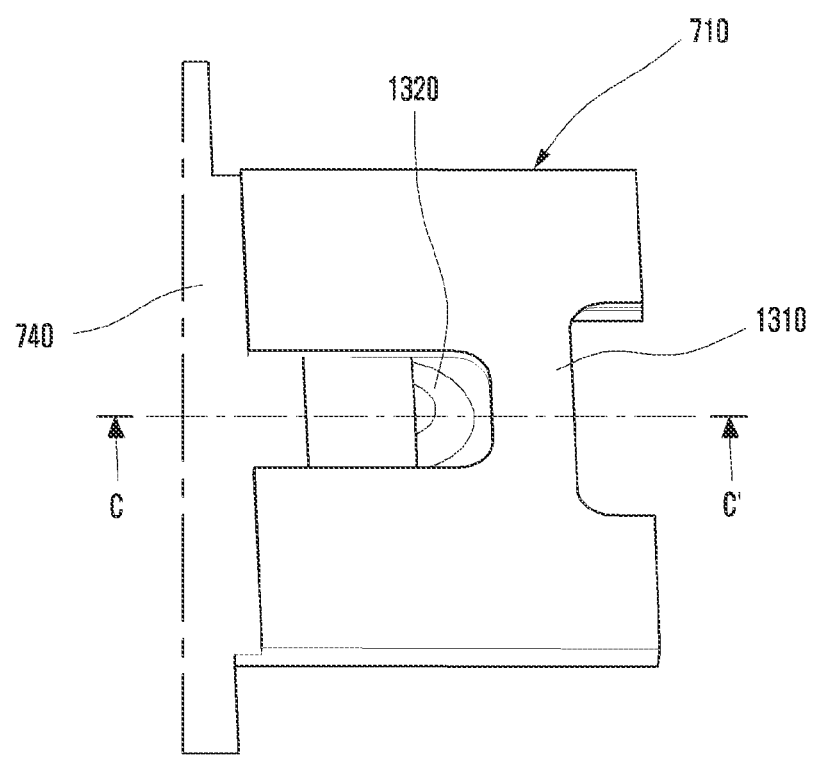
FIG. 13A is a diagram illustrating a first fastening part of FIG. 11 according to various embodiments.
Figure 13B:
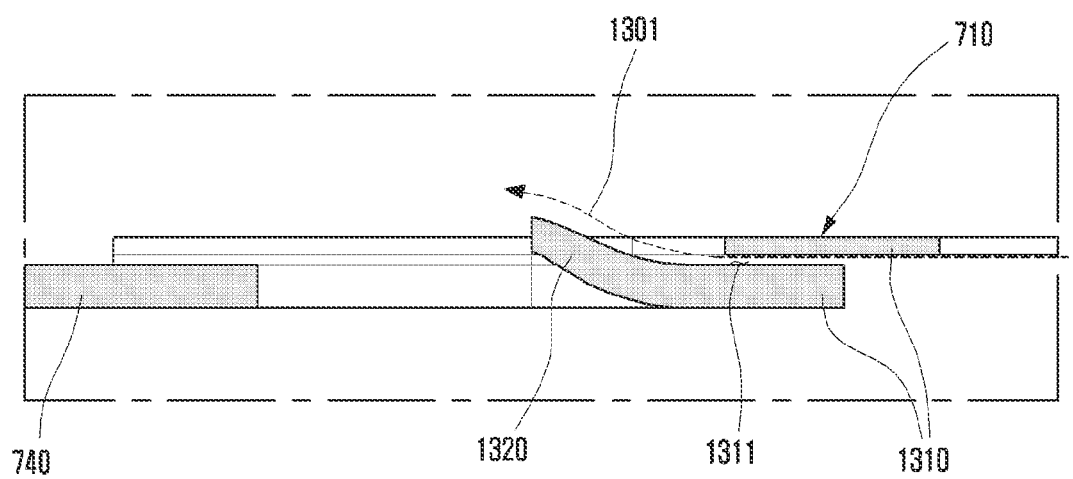
FIG. 13B is a cross-sectional view of the first fastening part of FIG. 13A taken along line C-C' according to various embodiments.
Figure 13C:
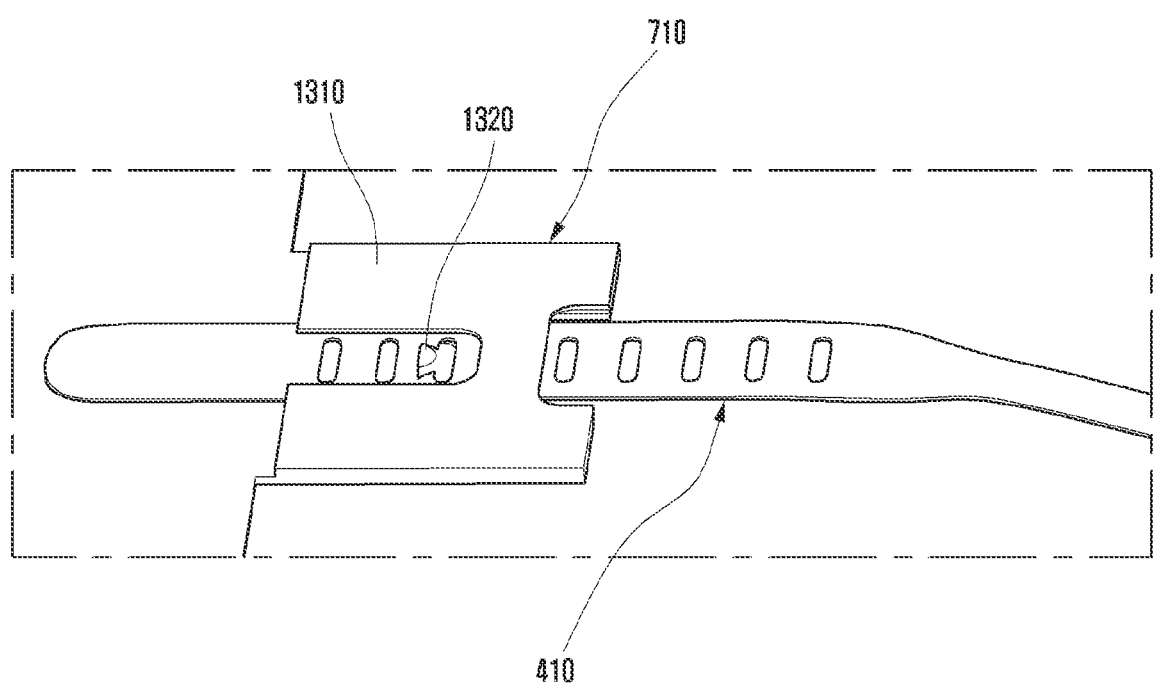
FIG. 13C is a perspective view illustrating a state in which the first fastening part and the first belt are connected to each other according to various embodiments.

FIG. 13A is a diagram illustrating the first fastening part 710 of FIG. 11 according to various embodiments. FIG. 13B is a cross-sectional view of the first fastening part 710 of FIG. 13A taken along line C-C' according to various embodiments. FIG. 13C is a perspective view illustrating a state in which the first fastening part 710 and the first belt 410 are connected to each other according to various embodiments.

Referring to FIGS. 13A, 13B, and 13C, in an embodiment, the first fastening part 710 may be connected to the support 740. The first fastening part 710 may include a structure 1310 including a through portion 1311 into which the first belt 410 of FIG. 12 can be inserted. The structure 1310 may include a hook 1320. After inserting the first belt 410 into the through portion 1311 as indicated by reference numeral "1301", a connection between the first fastening part 710 and the first belt 410 and a connection position thereof may be determined through a method of fastening the hook 1320 to one of the plurality of fastening holes 1220 (see FIG. 12). The tension of the first belt 410 may vary depending on the connection position between the first fastening part 710 and the first belt 410. The connection method between the second fastening part 720 and the second belt 420 of FIG. 11 may be substantially the same as the connection method between the first fastening part 710 and the first belt 410. The connection method between the third fastening part 730 and the third belt 430 of FIG. 11 may be substantially the same as the connection method between the first fastening part 710 and the first belt 410.

Referring to FIGS. 3 and 11, the connection position between the first belt 410 and the first fastening part 710, the connection position between the second belt 420 and the second fastening part 720, and the connection position between the third belt 430 and the third fastening part 730 may be adjusted such that the tension applied to the support sheet 370 is within a threshold range. When the tension applied to the flexible display 130 and the attached support sheet 370 is in the threshold range, the first bendable section 133 can be maintained in a shape smoothly connected to the first section 131 without lifting in the closed state of FIG. 1A or the open state of FIG. 2A. When the tension applied to the flexible display 130 and the attached support sheet 370 is in the threshold range, the first bendable section 133 can be moved while maintaining the shape smoothly connected to the first section 131 without lifting in the closed state of FIG. 1A and the open state of FIG. 2A. When the tension applied to the flexible display 130 and the attached support sheet 370 is in the threshold range, the slide operation can be smoothly performed during the switching between the closed state of FIG. 1A and the open state of FIG. 2A. A device for adjusting the tension of a belt (e.g., the first belt 410, the second belt 420, or the third belt 430) (hereinafter, referred to as a "tension adjusting device") may be implemented in various other methods. According to various embodiments, the number of belts or other pulleys positioned to be spaced apart from the first pulley 360 to correspond to the belts may vary without being limited to the embodiment of FIG. 3 or 11, and the number of tension adjusting devices provided to correspond thereto may also vary. For example, the pulleys corresponding to the belts may be provided in an even number, and the tension adjusting devices corresponding to the pulleys may also be implemented in an even number. A state in which the tension of at least one of the first belt 410, the second belt 420, and the third belt 430 is out of a threshold range, and thus the first bendable section 133 lifts or is not smoothly connected to the first section 131 or a state in which the sliding operation is not smooth may occur. In this case, a measure of adjusting the tension of the first belt 410, the second belt 420, or the third belt 430 using a tension adjusting device may be executed. According to an embodiment, it may be identified whether or not tension adjustment of the first belt 410 is required based on a position at which the hook 1320 is fastened among the plurality of fastening holes 1220 (see FIG. 12). It may also be identified whether or not tension adjustment is required for the second belt 420 or the third belt 430 in the same manner. According to various embodiments (not illustrated), a belt (e.g., the first belt 410, the second belt 420, or the third belt 430) may include a gradation, wherein it may be confirmed whether or not tension adjustment is required by identifying the position at which the belt is fastened to the support sheet 370 or the sliding plate 120 of FIG. 3 through the gradation. According to various embodiments (not illustrated), the electronic device 100 of FIG. 1A may include a belt (e.g., the first belt 410, the second belt 420, or the third belt 430), a support sheet 470, or at least one sensor (e.g., a tension sensor or a strain gauge) for detecting tension in the first bendable section 133 of the flexible display 130. The electronic device 100 may detect the tension of the first belt 410, the second belt 420, or the third belt 430 based on a sensor value acquired through the at least one sensor. The electronic device 100 may be implemented to identify a belt requiring tension adjustment and to output an identified result via the flexible display 130 or other various output devices (e.g., a speaker).

Figure 14:
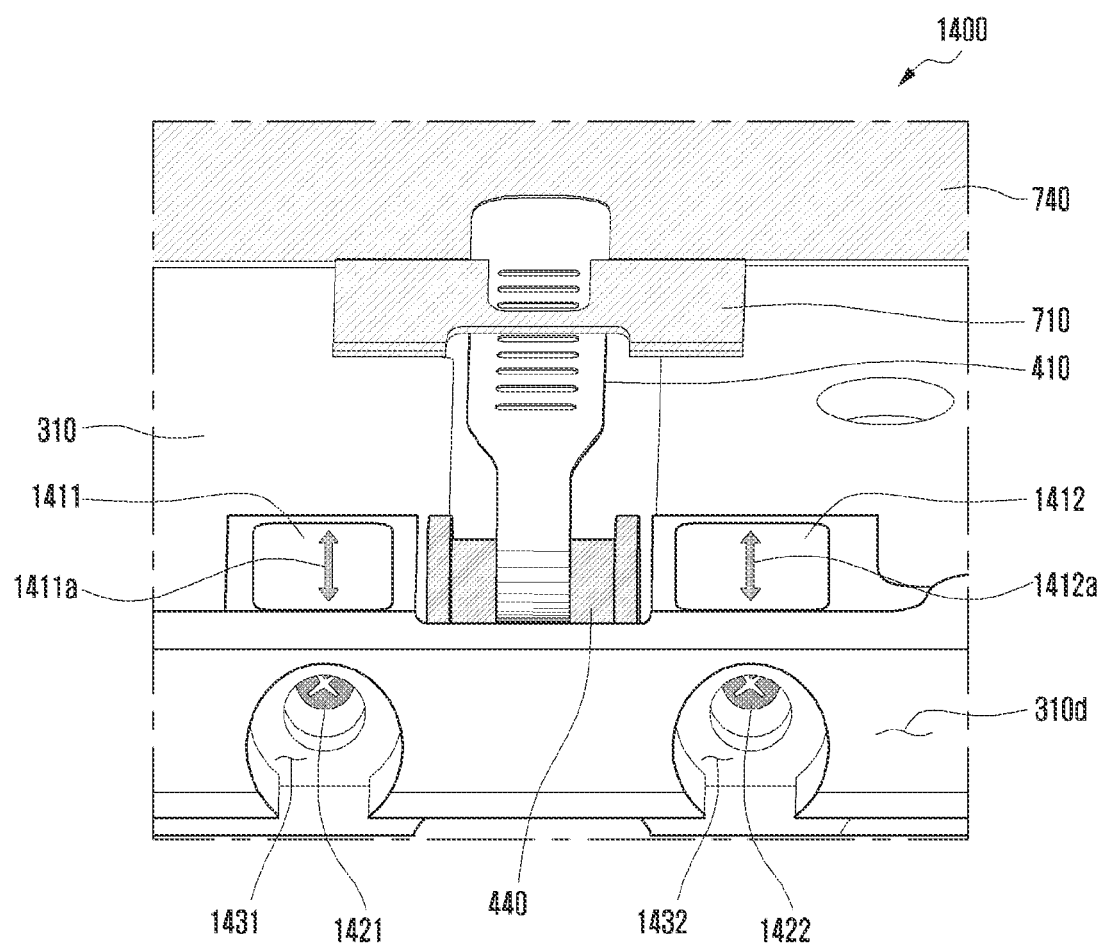
FIG. 14 is a perspective view illustrating a tension adjusting device for a first belt according to various embodiments.

FIG. 14 is a perspective view illustrating a tension adjusting device 1400 for the first belt 410 according to various embodiments.

Referring to FIG. 14, in an embodiment, the tension adjusting device 1400 may further include a first moving member 1411, a second moving member 1412, a first screw 1421, and/or a second screw 1422. A redundant description of some of the reference numerals in FIG. 14 may not be repeated here. The first moving member 1411 and the second moving member 1412 may be located on the first support member 310 to be spaced apart from each other with the second pulley 440 interposed therebetween. The first moving member 1411 may be connected to one rotation shaft (not illustrated) of the second pulley 440, and the second moving member 1412 may be connected to the other rotation shaft of the second pulley 440 (not illustrated). The first support member 310 may include a first opening 1431 and a second opening 1432 provided in the fourth side surface 310*d*. The first screw 1421 may be connected to the first moving member 1411 through the first opening 1431. The second screw 1422 may be connected to the second moving member 1412 through the second opening 1432. When the first screw 1421 is rotated, the moving direction and the moving distance of the first moving member 1411 may be adjusted based on the rotating direction and the number of revolutions of the first screw 1421. When the second screw 1422 is rotated, the moving direction and the moving distance of the second moving member 1412 may be adjusted based on the rotating direction and the number of revolutions of the second screw 1422. The tension of the first belt 410 connected to the second pulley 440 may be adjusted depending on the moving direction 1411*a* of the first moving member 1411 connected to the second pulley 440 and/or the moving direction 1412a of the second moving member 1412. According to various embodiments, the rotation shafts of the second pulley 440 may be tilted depending on the position of the first moving member 1411 and the position of the second moving member 1412.

According to various embodiments, the tension adjusting device for the second belt 420 or the third belt 430 of FIG. 11 may be implemented to be substantially the same as the tension adjusting device 1400 according to the embodiment of FIG. 14.

Figure 15A:
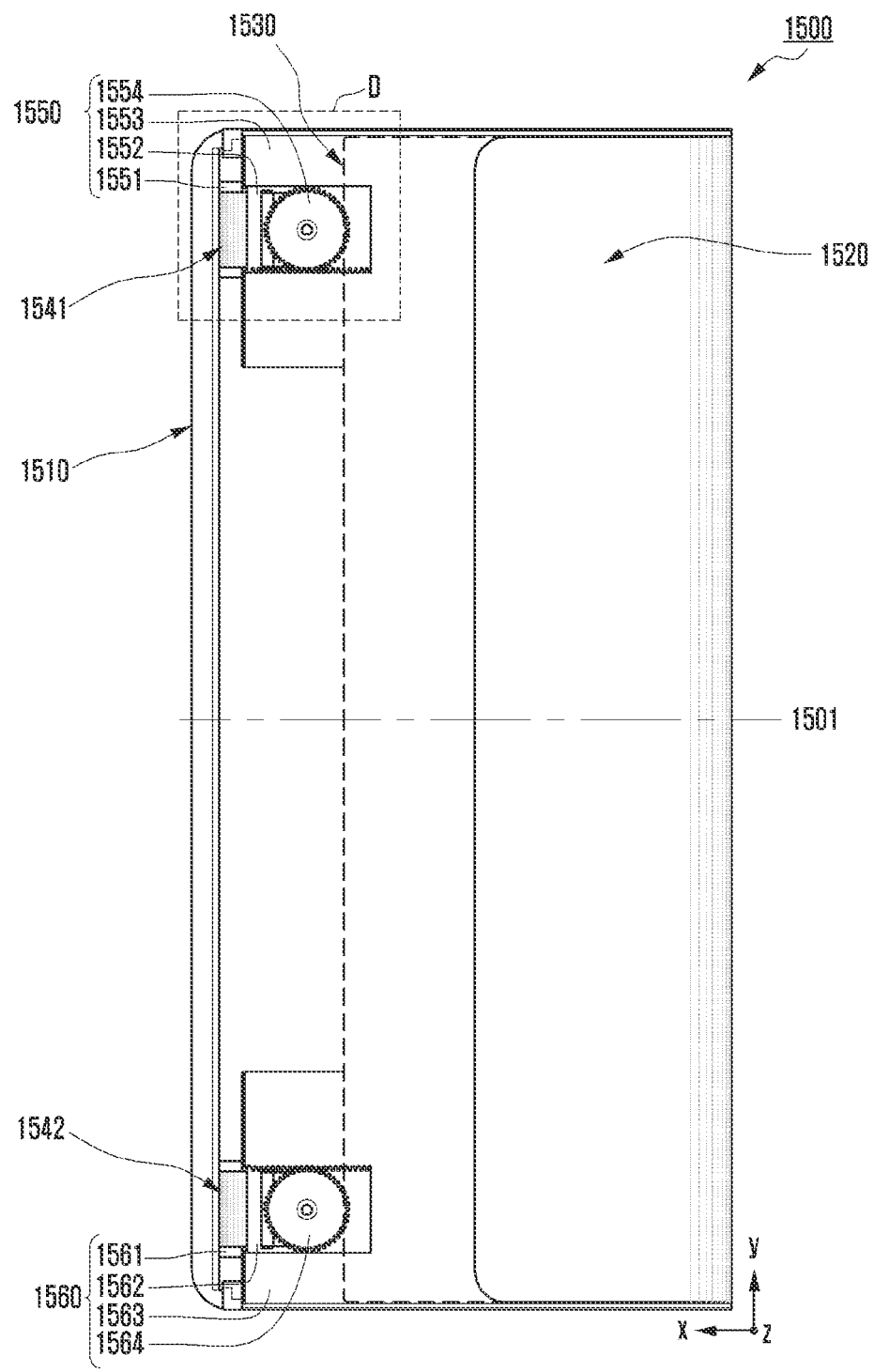
FIG. 15A is a diagram illustrating a portion of an electronic device including a tension adjusting device according to various embodiments.
Figure 15B:
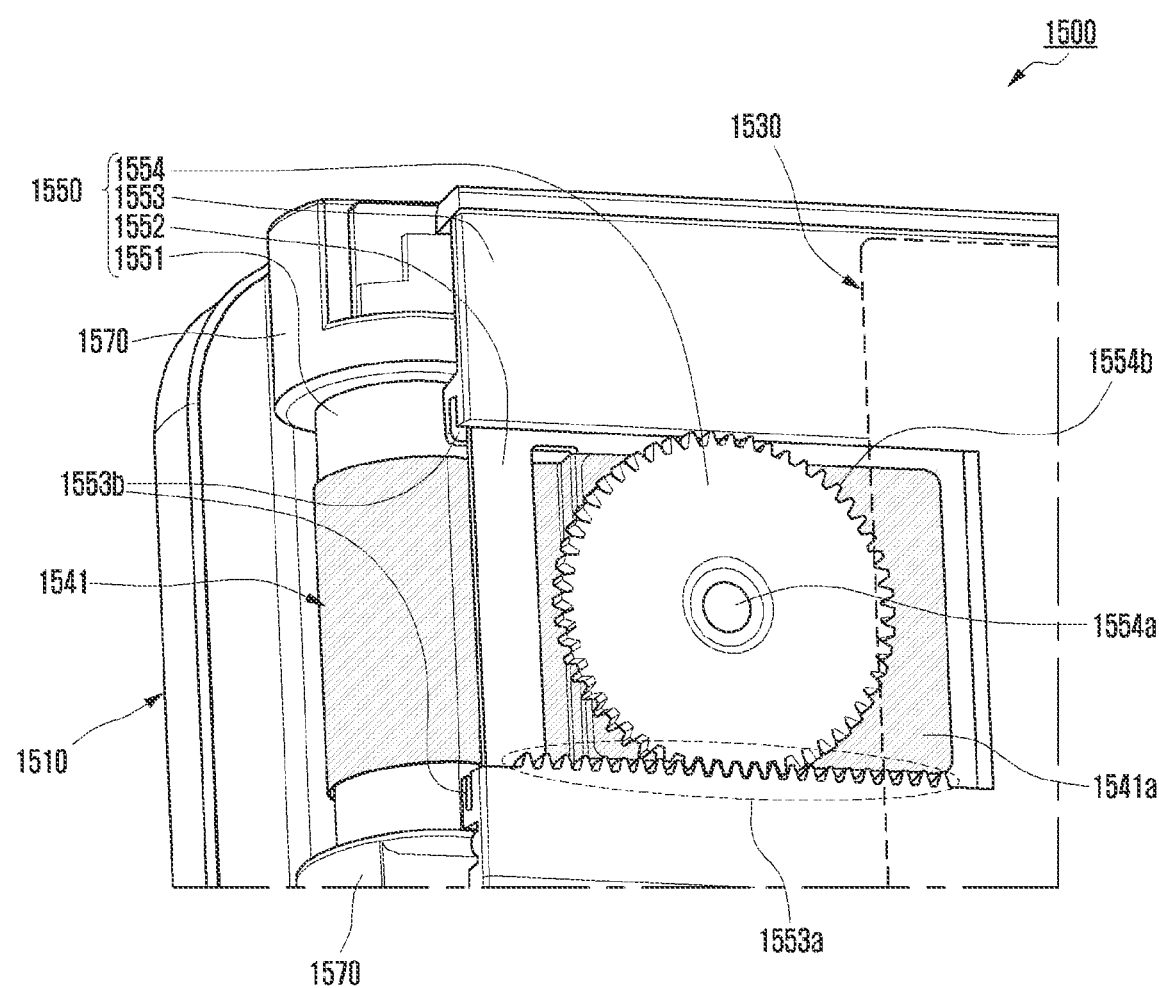
FIG. 15B is a partial perspective view illustrating the portion indicated by reference numeral "D" of the electronic device of FIG. 15A according to various embodiments.
Figure 15C:
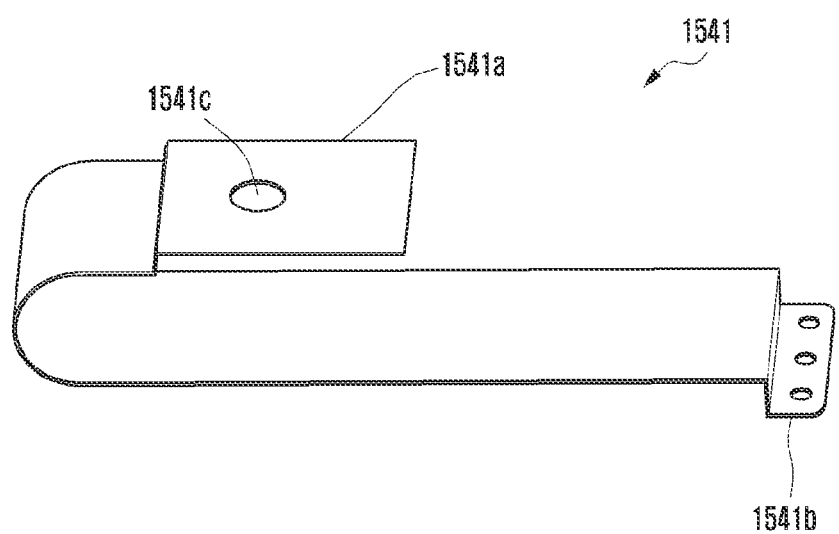
FIG. 15C is a diagram illustrating a belt included in the electronic device of FIG. 15A according to various embodiments.

FIG. 15A is a diagram illustrating a portion of an electronic device 1500 including a tension adjusting device according to various embodiments. FIG. 15B is a partial perspective view illustrating the portion indicated by reference numeral "D" of the electronic device 1500 of FIG. 15A according to various embodiments. FIG. 15C is a diagram illustrating a belt 1530 included in the electronic device 1500 of FIG. 15A according to various embodiments.

The electronic device 1500 of FIG. 15A may be implemented to include at least one of the components of the electronic device 100 of FIG. 3, or may be implemented by replacing at least one of the components of the electronic device 100 of FIG. 3 with another component.

Referring to FIG. 15A, in an embodiment, the electronic device 1500 may include a sliding plate 1510, a flexible display 1520, a support sheet 1530, a first belt 1541, a second belt 1542, a first tension adjusting device 1550 and/or a second tension adjusting device 1560. The sliding plate 1510 may include, for example, the sliding plate 120 of FIG. 3. The sliding plate 1510 may slide out in the +x-axis direction. The flexible display 1520 may include, for example, the flexible display 130 of FIG. 3. The support sheet 1530 may include, for example, the support sheet 370 of FIG. 3.

Referring to FIGS. 15A and 15B, in an embodiment, the first tension adjusting device 1550 may include a first curved member 1551, a first moving plate 1552, a first holder 1553, or a first gear 1554. The first holder 1553 may be coupled to the support sheet 1530 (e.g., the third section 372 of the support sheet 370 in FIG. 3). The first moving plate 1552 may be disposed in the first holder 1553 to be movable in the first holder 1553. The first holder 1553 may include an opening (not illustrated), and the first moving plate 1552 may be inserted into a groove 1553b provided in the inner surface of the opening in a sliding manner, so that the first holder 1553 is movable on the first moving plate 1552. Referring to FIGS. 15B and 15C, in an embodiment, the first belt 1541 may include one end 1541a connected to the first moving plate 1552 and the other end 1541b connected to the sliding plate 1510. The first gear 1554 may include first teeth 1554b having the same interval on the disk-shaped rotating body. The rotation shaft 1554a of the first gear 1554 may be rotatably connected to the moving plate 1552. One end 1541a of the first belt 1541 may be disposed between the moving plate 1552 and the first gear 1554, and a through hole 1541c provided in the one end 1541a of the first belt 1541 may be penetrated by the rotation shaft 1541a of the first gear 1541. The first holder 1553 may include second teeth 1553a provided on a straight line of one side edge of the opening. When the first gear 1541 is rotated, due to the engagement between the first teeth 1554b of the first gear 1541 and the second teeth 1553a of the first holder 1553, the first gear 1541 can be rectilinearly moved. The tension of the first belt 1541, which is in face-to-face contact with the first curved member 1551, may be adjusted depending on the moving direction and the moving distance of the first gear 1541. According to various embodiments, the first curved member 1551 may include a pulley rotatably coupled to the support member 1570 (e.g., the support member assembly 300 in FIG. 3). The second tension adjusting device 1560 may include a second curved member 1561, a second moving plate 1562, a second holder 1563, and/or a second gear 1564. The second tension adjusting device 1560 may be implemented in substantially the same manner as the first tension adjusting device 1550. The first tension adjusting device 1550 and the second tension adjusting device 1560 may be symmetrical to each other with respect to the center line 1501 of the electronic device 1500 in the y-axis direction (e.g., the center line of the screen in the y-axis direction). According to various embodiments, the first holder 1553 and the second holder 1563 may be implemented as an integral holder, wherein the integral holder may extend from the first tensioning device 1550 to the second tensioning device 1560. According to various embodiments, the number or positions of the tension adjusting devices may vary without being limited to the embodiment of FIG. 15A. The tension adjusting device according to the embodiment of FIG. 15A may be applied to the electronic device 100 of FIG. 3 such that the tension of the first belt 410, the tension of the second belt 420, or the tension of the third belt 430 can be adjusted. A variety of other tension adjusting devices may be implemented.

Figure 16A:
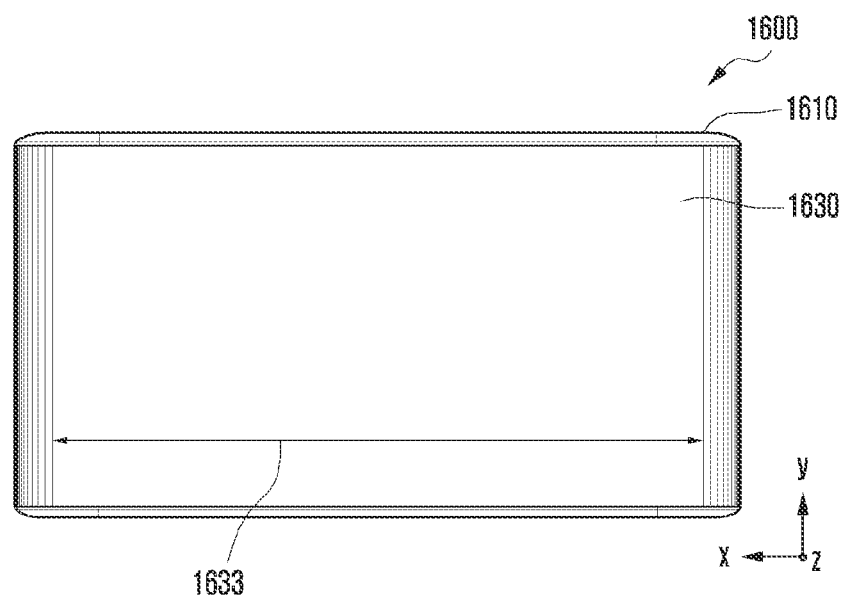
FIGS. 16A and 16B are diagrams illustrating an electronic device according to various embodiments.
Figure 16B:
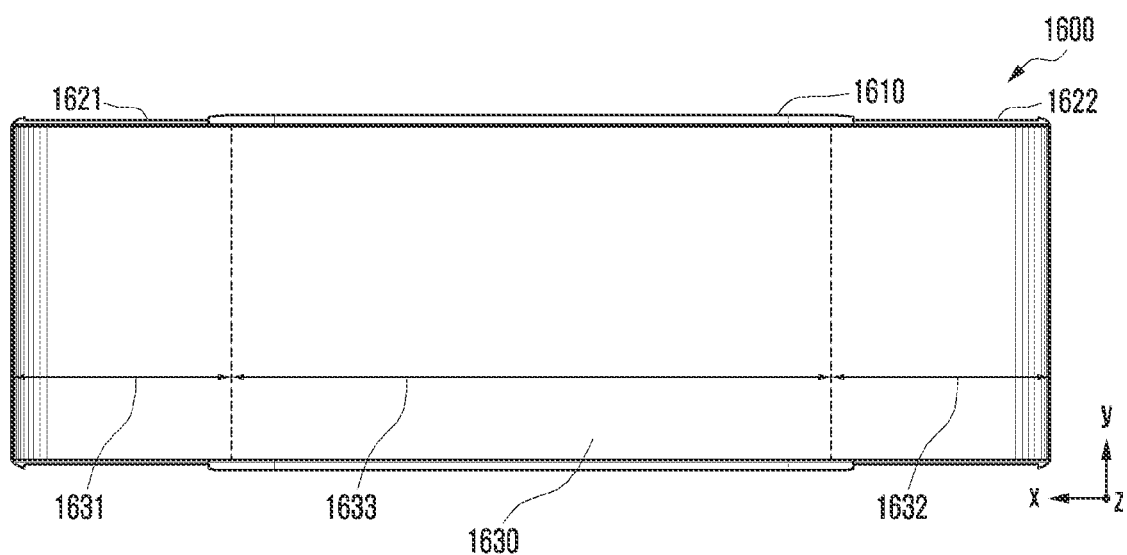

FIGS. 16A and 16B are diagrams illustrating an electronic device 1600 according to various embodiments.

In an embodiment, the electronic device 1600 may be implemented such that the screen thereof is expandable to both sides. FIG. 16A is a diagram illustrating the electronic device 1600 in a state in which the screen is not expanded (hereinafter, referred to as a "closed state"). FIG. 16B is a diagram illustrating the electronic device 1600 in a state in which the screen is expanded to both sides (e.g., a "both side open state"). Although not illustrated, the electronic device 1600 may be in a state in which the screen is expanded to one side (e.g., a "one side open state").

Referring to FIGS. 16A and 16B, the electronic device 1600 may include a housing 1610, a first sliding plate 1621 that is capable of sliding out from the housing 1610 in the +x-axis direction, and/or a second sliding plate 1622 capable of being slid out from the housing 1610 in the −x-axis direction. The flexible display 1630 may include a first bendable section 1631 pulled out from the inner space of the housing 1610 when the first sliding plate 1621 slides out. The first sliding plate 1621 may support the first bendable section 1631 when sliding out. The flexible display 1630 may include a second bendable section 1632 pulled out from the inner space of the housing 1610 when the second sliding plate 1622 slides out. The second sliding plate 1622 may support the second bendable section 1632 when sliding out. The flexible display 1630 may include a flat section 1633 between the first bendable section 1631 and the second bendable section 1632.

According to an embodiment, the electronic device 1600 may include at least one elastic structure (e.g., the elastic structure 490 in FIG. 3) for the first sliding plate 1621. When the first sliding plate 1621 is moved by a set distance by an external force, the electronic device 1600 may be switched from the closed state to the open state or from the open state to the closed state without any further external force due to the at least one elastic structure.

According to an embodiment, the electronic device 1600 may include at least one elastic structure (e.g., the elastic structure 490 in FIG. 3) for the second sliding plate 1622. When the second sliding plate 1622 is moved by a set distance by an external force, the electronic device 1600 may be switched from the closed state to the open state or from the open state to the closed state without any further external force due to the at least one elastic structure.

According to an embodiment, the electronic device may include various elements that make the first bendable section 1631 maintained in a shape smoothly connected to the flat section 1633 of the flexible display 1630 without lifting when the screen is expanded or contracted. This will be described in greater detail below with reference to FIG. 17A or 17B.

Figure 17A:
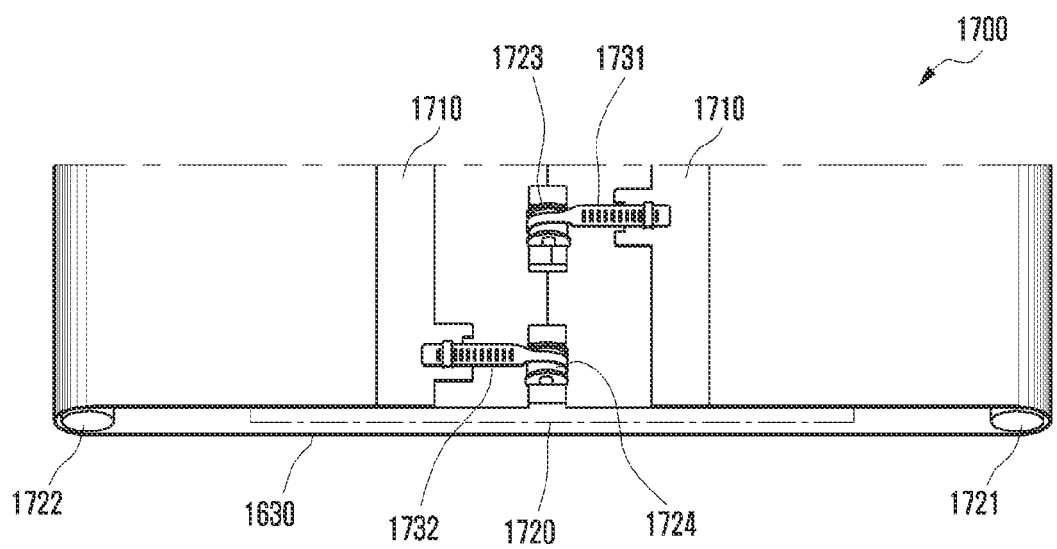
FIG. 17A is a partial perspective view illustrating a portion of the electronic device of FIG. 16A according to various embodiments.

FIG. 17A is a diagram illustrating a portion of the electronic device 1600 of FIG. 16A according to various embodiments.

Referring to FIG. 17A, in an embodiment, the electronic device 1700 may include a flexible display 1630, a support sheet 1710, a support member 1720, a first pulley 1721, a second pulley 1722, a third pulley 1723, a fourth pulley 1724, a first belt 1731, and/or a second belt 1732.

According to an embodiment, the support sheet 1710 may be disposed on the rear surface of the flexible display 1630 or may be included in the flexible display 1630. The support sheet 1710 may include a first lattice structure (e.g., the lattice structure 702 in FIG. 7B) provided to correspond to the first bendable section 1631 in FIG. 16B. The first lattice structure may contribute to flexibility of a corresponding portion of the support sheet 1710 that corresponds to the first bendable section 1631. The support sheet 1710 may include a second lattice structure (e.g., the lattice structure 702 in FIG. 7B) provided to correspond to the second bendable section 1632 of FIG. 16B. The second lattice structure may contribute to flexibility of a corresponding portion of the support sheet 1710 that corresponds to the second bendable section 1632. The support sheet 1710 may reduce the effect of a load or stress that may occur when the screen is expanded or contracted, on the flexible display 1630.

According to an embodiment, the support member 1720 may be located inside the housing 1610 of FIG. 16A or 16B to contribute to durability or rigidity of the electronic device 1600. The first sliding plate 1621 and/or the second sliding plate 1622 of FIG. 16B may be slidably disposed on the support member 1720.

According to an embodiment, the first pulley 1721 may be connected to the first bendable section 1631 of FIG. 16B. The first pulley 1721 may be connected to the first sliding plate 1621 of FIG. 16B to be moved together with the first sliding plate 1621. The second pulley 1722 may be connected to the second sliding plate 1622 of FIG. 16B to be moved together with the second sliding plate 1622.

According to an embodiment, the third pulley 1723 may have a rotation shaft parallel to the first pulley 1721, and may be located on the support member 1720 to be spaced apart from the first pulley 1721 in the direction opposite to the direction in which the first sliding plate 1621 of FIG. 16B slides out. The fourth pulley 1724 may have a rotation shaft parallel to the second pulley 1722, and may be located on the support member 1720 to be spaced apart from the second pulley 1722 in the direction opposite to the direction in which the second sliding plate 1622 of FIG. 16B slides out. According to an embodiment, the rotation shaft of the third pulley 1723 and the rotation shaft of the fourth pulley 1724 may be placed on a straight line.

According to an embodiment, one end (not illustrated) of the first belt 1731 may be connected to the support sheet 1710, and the other end (not illustrated) of the first belt 1731 may be connected to the first sliding plate 1621 of FIG. 16B. The third pulley 1723 may be connected to the first belt 1731. During the switching between the open state and the closed state, the force for moving the first sliding plate 1621 on the support member 1720 may cause the movement of the first bendable section 1631, the movement of the first belt 1731, the rotation of the first pulley 1721, and the rotation of the third pulley 1723. The number or positions of the third pulleys 1723 and the first belts 1731 connected thereto, or the number or positions of the fourth pulleys 1724 and the second belts 1732 connected thereto is not limited to the embodiment of FIG. 17A and may vary.

According to an embodiment, one end (not illustrated) of the second belt 1732 may be connected to the support sheet 1710, and the other end (not illustrated) of the second belt 1732 may be connected to the second sliding plate 1622 of FIG. 16B. The fourth pulley 1724 may be connected to the second belt 1732. During the switching between the open state and the closed state, the force for moving the second sliding plate 1622 on the support member 1720 may cause the movement of the second bendable section 1632, the movement of the second belt 1732, the rotation of the second pulley 1722, and the rotation of the fourth pulley 1724. According to an embodiment, the tension of the first belt 1731 and the tension of the second belt 1732 may contribute to making the first bendable section 1631 and the second bendable section 1632 maintain a shape smoothly connected to the flat section 1633 without lifting. The tension of the first belt 1731 or the tension of the second belt 1732 may be adjusted through various tension adjusting devices as in the embodiment of FIG. 13C.

According to various embodiments, a reinforcing sheet (e.g., the reinforcing sheet 810, 820, or 830 in FIG. 8) may be attached to the first lattice structure of the support sheet 1710 that corresponds to the first bendable section 1631 of FIG. 16B so that stretching of the first lattice structure can be prevented or reduced, and the tension of the first belt 1731 can be maintained. According to various embodiments, the support sheet 1710 may be implemented by applying the embodiment of FIG. 9 or the embodiment of FIG. 10 in order to prevent and/or reduce stretching of the first lattice structure. By also preventing and/or reducing the second lattice structure of the support sheet 1710 that corresponds to the first bendable section 1631 of FIG. 16B from stretching based on the embodiment of FIG. 8, the embodiment of FIG. 9, or the embodiment of FIG. 10, the tension of the second belt 1732 can be maintained.

According to various embodiments, the electronic device 1700 may include a first multi-bar structure (e.g., the multi-bar structure 380 in FIG. 3) extending between the support sheet 1710 and the first pulley 1721 from the first sliding plate 1621 of FIG. 16B. The electronic device 1700 may include a second multi-bar structure (e.g., the multi-bar structure 380 in FIG. 3) extending between the support sheet 1710 and the second pulley 1722 from the second sliding plate 1621 of FIG. 16B. The first multi-bar structure and the second multi-bar structure may make the first bendable section 1631 and the second bendable section 1631 of FIG. 16B maintain a shape smoothly connected to the flat section 1633 in the closed state or the open state of the electronic device 1700, or during the switching of the electronic device 1700 between the closed state and the open state.

Figure 17B:
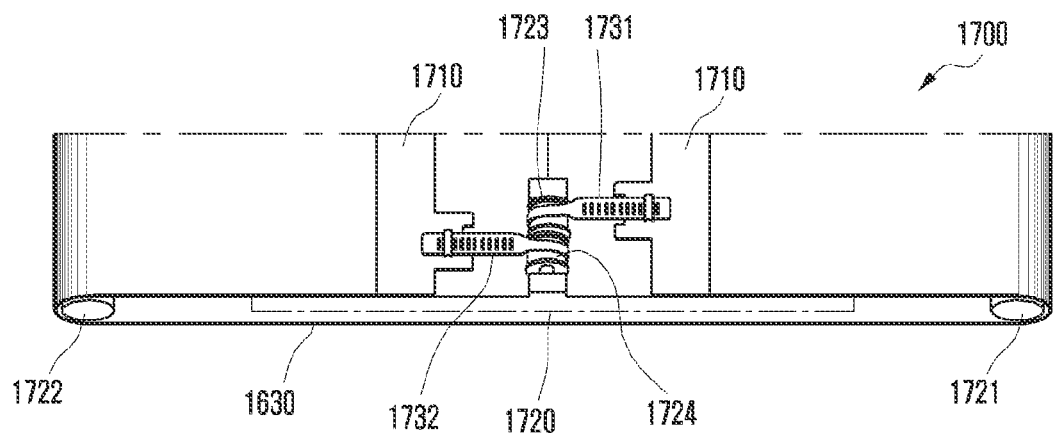
FIG. 17B is a partial perspective view illustrating a portion of the electronic device of FIG. 16A according to various embodiments.

FIG. 17B is a diagram illustrating a portion of the electronic device 1600 of FIG. 16A according to various embodiments.

Referring to FIG. 17B, in various embodiments, the third pulley 1723 and the fourth pulley 1724 may be located adjacent to each other. Due to this, the tension of the first belt 1731 connected to the third pulley 1723 and the tension of the second belt 1732 connected to the fourth pulley 1724 may be concentrated.

According to an example embodiment of the disclosure, an electronic device (e.g., the electronic device 100 in FIG. 3) may include: a housing (e.g., the housing 110 in FIG. 1A), and a sliding plate (e.g., the sliding plate 120 of FIG. 3, 4, or 5) capable of sliding out of the housing. The electronic device may include a flexible display (e.g., the flexible display 130 in FIG. 3, 4, or 4). The flexible display may include a first section (e.g., the first section 131 of FIG. 3, 4, or 5) overlappingly coupled to the sliding plate, and a bendable section (e.g., the first bendable section 133 in FIG. 3, 4, or 5) extending from the first section and configured to be pulled out of the inner space of the housing during the slide-out. The electronic device may include a support sheet (e.g., the support sheet 370 in FIG. 3, 4, or 5) disposed on the rear surface of the flexible display. The electronic device may include a first curved portion (e.g., the first pulley 360 in FIG. 3, 4, or 5) located inside the housing corresponding to the bendable section. The electronic device may include a belt (e.g., the first belt 410, the second belt 420, or the third belt 430 in FIG. 3) interconnecting the support sheet and the sliding plate. The electronic device may include a second curved portion (e.g., the second pulley 440, the third pulley 450, or the fourth pulley 460 in FIG. 3). The second curved member may be located inside the housing corresponding to the belt, and may be spaced apart from the first curved portion in the slide-out direction.

According to an example embodiment of the disclosure, the first curved portion or the second curved portion may include a pulley. For example, the first curved portion may include the first pulley 360 of FIG. 3. For example, the second curved portion may include the second pulley 440, the third pulley 450, or the fourth pulley 460 in FIG. 3.

According to an example embodiment of the disclosure, the support sheet (e.g., the support sheet 370 of FIG. 3, 4, or 5) may include a lattice structure (e.g., the lattice structure 702 in FIG. 7B) including a plurality openings (e.g., the plurality of openings 701 in FIG. 7B) corresponding to the bendable section (e.g., the first bendable section 133 in FIG. 6).

According to an example embodiment of the disclosure, the support sheet (e.g., the support sheet 370 in FIG. 7B) may include a second section (e.g., the second section 371 in FIG. 7B) and a third section (e.g., the third section 372 in FIG. 7B) arranged with the lattice structure (e.g., the lattice structure 702 of FIG. 7B) interposed therebetween. The second section may be connected to the sliding plate (e.g., the sliding plate 120 in FIG. 3, 4, or 5). The third section may be connected to the belt (e.g., the first belt 410, the second belt 420, or the third belt 430 in FIG. 3).

According to an example embodiment of the disclosure, the electronic device (e.g., the electronic device 100 of FIG. 1A) may further include at least one reinforcing sheet (e.g., the first reinforcing sheet 810, the second reinforcing sheet 820, or the third reinforcing sheet 830 in FIG. 8). The at least one reinforcing sheet may be attached to the support sheet (e.g., the support sheet 370 in FIG. 8) and may interconnect the second section (e.g., the second section 371 in FIG. 8) and the third section (e.g., the third section 372 in FIG. 8) across the lattice structure (e.g., the lattice structure 702 in FIG. 7B).

According to an example embodiment of the disclosure, the reinforcing sheet (e.g., the first reinforcing sheet 810, the second reinforcing sheet 820, or the third reinforcing sheet 830 of FIG. 8) may include stainless steel.

According to an example embodiment of the disclosure, the lattice structure may include at least one first area and at least one second area (e.g., the first lattice structure 1010, the second lattice structure 1020, or third lattice structure 1030 in FIG. 10). The at least one first area and the at least one second area may extend across the second section (e.g., the second section 371 in FIG. 10) and the third section (e.g., the third section 372 in FIG. 10). The at least one second area including a smaller number of openings than the at least one first area.

According to an example embodiment of the disclosure, the lattice structure may not be provided in at least one area (e.g., the first area 910, the second area 920, or third area 930 in FIG. 9) extending across the second section (e.g., the second section 371 in FIG. 9) and the third section (e.g., the third section 372 in FIG. 9).

According to an example embodiment of the disclosure, the support sheet (e.g., the support sheet 370 in FIG. 3, 4, 5, 6, 7B, 8, 9, or 10) may include stainless steel.

According to an example embodiment of the disclosure, the support sheet (e.g., the support sheet 370 in FIG. 3, 4, 5, 6, 7B, 8, 9, or 10) may include engineering plastic.

According to an example embodiment of the disclosure, the electronic device (e.g., the electronic device 100 of FIG. 1A) may further include a tension adjusting device configured to adjust the tension of the belt (e.g., the first belt 410, the second belt 420, or the third belt 430 in FIG. 3).

According to an example embodiment of the disclosure, the tension adjusting device may include a plurality of fastening holes (e.g., the plurality of fastening holes 1220 in FIG. 12) provided in the belt (e.g., the first belt 410 in FIG. 12) and arranged in the longitudinal direction of the belt. The tension adjusting device may include a hook (e.g., the hook 1320 in FIG. 13A or 13B) disposed on the support sheet (e.g., the support 740 included in the support sheet 370 of FIG. 11) and capable of being fastened to the plurality of fastening holes. The tension may be changed depending on a position at which the hook is fastened to the plurality of fastening holes.

According to an example embodiment of the disclosure, the tension adjusting device may include a moving portion (e.g., the first moving member 1411 or the second moving member 1412) connected to the second curved member (e.g., the second pulley 440 in FIG. 14), and a screw (e.g., the first screw 1421 or the second screw 1422 in FIG. 14) connected to the moving portion. The second curved member may be moved together with the moving portion based on the rotation of the screw, and the tension may be changed depending on the position of the second curved member.

According to an example embodiment of the disclosure, the electronic device (e.g., the electronic device 100 of FIG. 3, 4, or 5) may further include a multi-bar support (e.g., the multi-bar structure 380 of FIG. 3, 4, or 5) extending from the sliding plate (e.g., the sliding plate 120 in FIG. 3, 4, or 5) to the space between the support sheet (e.g., the support sheet 370 in FIG. 3, 4, or 5) and the first curved member (e.g., the first pulley 360 of FIG. 3, 4, or 5).

According to an example embodiment of the disclosure, the electronic device (e.g., the electronic device 100 of FIG. 3) may further include an elastic structure (e.g., the elastic structure 490 in FIG. 3) comprising an elastic material disposed between the housing (e.g., the housing 110 in FIG. 1A) and the sliding plate (e.g., the sliding plate 120 in FIG. 1A). The elastic structure may be configured to provide a force for moving the sliding plate.

According to various example embodiments of the disclosure, an electronic device (e.g., the electronic device 100 in FIG. 1A) may include: a housing (e.g., the housing 110 in FIG. 1A), and a sliding plate (e.g., the sliding plate 120 of FIG. 3, 4, or 5) capable of sliding out of the housing. The electronic device may include a flexible display (e.g., the flexible display 130 in FIG. 3, 4, or 5). The flexible display may include a first section (e.g., the first section 131 of FIG. 3, 4, or 5) overlappingly coupled to the sliding plate, and a bendable section (e.g., the first bendable section 133 in FIG. 3, 4, or 5) extending from the first section and configured to be pulled out of the inner space of the housing during the slide-out. The electronic device may include a support sheet (e.g., the support sheet 370 of FIG. 3, 4, or 5). The support sheet may be disposed on the rear surface of the flexible display or may be included in the flexible display. The electronic device may include a first pulley (e.g., the first pulley 360 in FIG. 3, 4, or 5) located inside the housing corresponding to the bendable section. The electronic device may include a belt (e.g., the first belt 410, the second belt 420, or the third belt 430 in FIG. 3) interconnecting the support sheet and the sliding plate. The electronic device may include a second pulley (e.g., the second pulley 430, the third pulley 440, or the fourth pulley 460 in FIG. 3) including a rotation shaft parallel to the first pulley, spaced apart from the first pulley in the slide-out direction, and located inside the housing, and connected to the belt.

According to various example embodiments of the disclosure, the support sheet (e.g., the support sheet 370 in FIG. 7B) may include a lattice structure (e.g., the lattice structure 720 in FIG. 7B) including a plurality openings (e.g., the plurality of openings 701 in FIG. 7B) corresponding to the bendable section (e.g., the first bendable section 133 in FIG. 6).

According to various example embodiments of the disclosure, the support sheet (e.g., the support sheet 370 in FIG. 7B) may include a second section (e.g., the second section 371 in FIG. 7B) and a third section (e.g., the third section in FIG. 7B) arranged with the lattice structure (e.g., the lattice structure 702 of FIG. 7B) interposed therebetween. The second section may be connected to the sliding plate (e.g., the sliding plate 120 in FIG. 3, 4, or 5). The third section may be connected to the belt (e.g., the first belt 410, the second belt 420, or the third belt 430 in FIG. 3).

According to various example embodiments of the disclosure, the electronic device (e.g., the electronic device 100 of FIG. 1A) may further include at least one reinforcing sheet (e.g., the first reinforcing sheet 810, the second reinforcing sheet 820, or the third reinforcing sheet 830 in FIG. 8). The at least one reinforcing sheet may be attached to the support sheet (e.g., the support sheet 370 in FIG. 8) and may interconnect the second section (e.g., the second section 371 in FIG. 8) and the third section (e.g., the third section 372 in FIG. 8) across the lattice structure (e.g., the lattice structure 702 in FIG. 7B).

According to various example embodiments of the disclosure, the belt (e.g., the first belt 410, the belt 420, or the third belt 430 of FIG. 3) may include stainless steel.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a housing;
a sliding plate disposed to be movable with respect to the housing;
a flexible display including a first section coupled to overlap the sliding plate, and a first bendable section extending from the first section and configured to be at least partially bent when the sliding plate moves;
a multi-bar structure, at least a portion of the multi-bar structure being configured to support the first bendable section of the flexible display;
a support sheet including a second section disposed on a rear surface of the first section of the flexible display, a second bendable section disposed on a rear surface of the first bendable section of the flexible display, and a third section disposed not to overlap the flexible display, wherein the second bendable section of the support sheet is located between the multi-bar structure and the first bendable section of the flexible display;
at least one fastening part disposed in the third section;
at least one belt connecting the at least one fastening part and the sliding plate to each other;
a first curved member located, in contact with the multi-bar structure, inside the housing; and
a second curved member located, in contact with the at least one belt, inside the housing and spaced apart from the first curved member in a direction in which the sliding plate moves with respect to the housing,
wherein a connection position on the at least one belt is adjustable when the at least one belt is connected between the at least one fastening part and the sliding plate, and
wherein the support sheet includes a lattice structure including a plurality of openings.

2. The electronic device of claim 1, wherein one or both of the first curved member and the second curved member includes a pulley.

3. The electronic device of claim 1, wherein the lattice structure of the support sheet is provided in correspondence with the first bendable section of the flexible display.

4. The electronic device of claim 3,
wherein the second section and the third section are arranged with the lattice structure interposed therebetween,
wherein the second section is connected to the sliding plate, and
wherein the third section is connected to the belt.

5. The electronic device of claim 4, further comprising:
at least one reinforcing sheet attached to the support sheet and connecting the second section and the third section across the lattice structure.

6. The electronic device of claim 5, wherein the at least one reinforcing sheet includes stainless steel.

7. The electronic device of claim 4, wherein the lattice structure includes at least one first area and at least one second area, the at least one first area and the at least one second area extending across the second section and the third section, the at least one second area including fewer openings than the at least one first area.

8. The electronic device of claim 4, wherein at least one area extending across the second section and the third section includes no lattice structure.

9. The electronic device of claim 1, wherein the support sheet includes stainless steel.

10. The electronic device of claim 1, wherein the support sheet includes engineering plastic.

11. The electronic device of claim 1, wherein the at least one belt includes a plurality of holes, and
   wherein a tension of the at least one belt is adjusted according to a position, corresponding to the connection position, of a hole to be fastened to the at least one fastening part among the plurality of holes.

12. The electronic device of claim 11, wherein the at least one fastening part includes a hook configured to be fastened to the plurality of holes,
   wherein the tension depends on a position at which the hook is fastened to the plurality of holes.

13. The electronic device of claim 1, further comprising:
   an elastic structure comprising an elastic material disposed between the housing and the sliding plate and configured to provide a force for moving the sliding plate.

* * * * *